United States Patent [19]
Capofreddi et al.

[11] Patent Number: 5,638,071
[45] Date of Patent: Jun. 10, 1997

[54] EFFICIENT ARCHITECTURE FOR CORRECTING COMPONENT MISMATCHES AND CIRCUIT NONLINEARITIES IN A/D CONVERTERS

[75] Inventors: Peter D. Capofreddi, Palo Alto; Edison Fong, Sunnyvale; Bill C. Wong, Milpitas, all of Calif.

[73] Assignee: National Semiconductor Corporation, Santa Clara, Calif.

[21] Appl. No.: 662,273

[22] Filed: Jun. 12, 1996

Related U.S. Application Data

[63] Continuation of Ser. No. 311,352, Sep. 23, 1994, abandoned.
[51] Int. Cl.$^6$ ................................................ H03M 1/06
[52] U.S. Cl. ................................................ 341/118; 341/120
[58] Field of Search ................................ 341/116, 120, 341/118, 155

[56] References Cited

U.S. PATENT DOCUMENTS

| | | | |
|---|---|---|---|
| 4,894,656 | 1/1990 | Hwang et al. | 341/120 |
| 4,975,700 | 12/1990 | Tan et al. | 341/118 |
| 5,047,772 | 9/1991 | Ribner | 341/156 |

OTHER PUBLICATIONS

Seung–Hoon Lee, et al., "*Digital–Domain Calibration of Multistep Analog–to–Digital Converters,*" IEEE Journal of Solid–State Circuits, vol. 27, No. 12, Dec. 1992, pp. 1679–1688.

Seung–Hoon Lee, et al., "*A Direct Code Error Calibration Technique for Two–Step Flash A/D converters,*" IEEE Transactions on Circuits and Systems, vol. 36, No. 6, Jun. 1989, pp. 919–922.

Khen–Sang Tan, et al., "*Error Correction Techniques for High–Performance Differential A/D Converters,*" IEEE Journal of Solid–State Circuits, vol. 25, No. 6, Dec. 1990, pp. 1318–1327.

Andrew N. Karanicolas, et al., "*WP 4.2: A 15b 1Ms/s Digitally Self–Calibrated Pipeline ADC,*" 1993 IEEE International Solid–State Circuits Conference, Session 4, Data Conversion, Feb. 24, 1993, pp. 60–61.

A.C. Dent, et al., "*Linearization of Analog–to–Digital Converters,*" IEEE Transactions on Circuits and Systems, vol. 37, No. 6, Jun. 1990, pp. 729–737.

Ziya G. Boyacigiller et al., "*WPM 6.5: An Error–Correcting 14b/20µs CMOS A/D Converter,*" 1981 IEEE International Solid–State Circuits Conference, Session VI: Acquisition Circuits, Feb. 18, 1981, pp. 62–63.

Khen–Sang Tan et al., "*TPM 10.5: A 5V 16b 10µs Differential CMOS ADC,*" 1990 IEEE International Solid–State Circuits Conference, Session 10, Analog–to–Digital Converters, Feb. 15, 1990, pp. 166–167.

Khen–Sang tan et al., "*TPM 10.5: A 5V, 16b 10µs Differential CMOS ADC,*" 1990 IEEE/ISSCC Slide Supplement, Session 10, Analog–to–Digital Convverters, p. 128.

R. Hester et al., "*Analog–to–Digital Convverter with Non–Linear Capacitor Compensation,*" 1989 Symposium on VLSI Circuit, pp. 57–58.

Harlan Ohara et al., "*C CMOS Programmable Self–Calibrating 13–bit Eight–Channel Data Acquistion Peripheral,*" IEEE Journal of Solid–State Circuits, vol. sc–22, No. 6, Dec. 1987, pp. 930–937.

Primary Examiner—Todd DeBoer
Attorney, Agent, or Firm—Limbach & Limbach L.L.P.

[57] ABSTRACT

An error correction technique for high-resolution analog-to-digital converters corrects for both component mismatch and circuit nonlinearity errors by utilizing look-up tables to store mismatch coefficients, which represent the errors introduced by component mismatch, as well as a series of offset and gain coefficients, which are utilized to form a piecewise-linear representation of the error introduced by circuit non-linearities. The use of an independent gain and offset parameter for each segment of the piecewise-linear representation allows discontinuous functions to be accommodated. This leads to a more efficient implementation since it allows the error introduced by mismatch in the components representing the most significant bits to be included in the piecewise linear table, while separate lookup tables are used for the less significant bits.

18 Claims, 30 Drawing Sheets

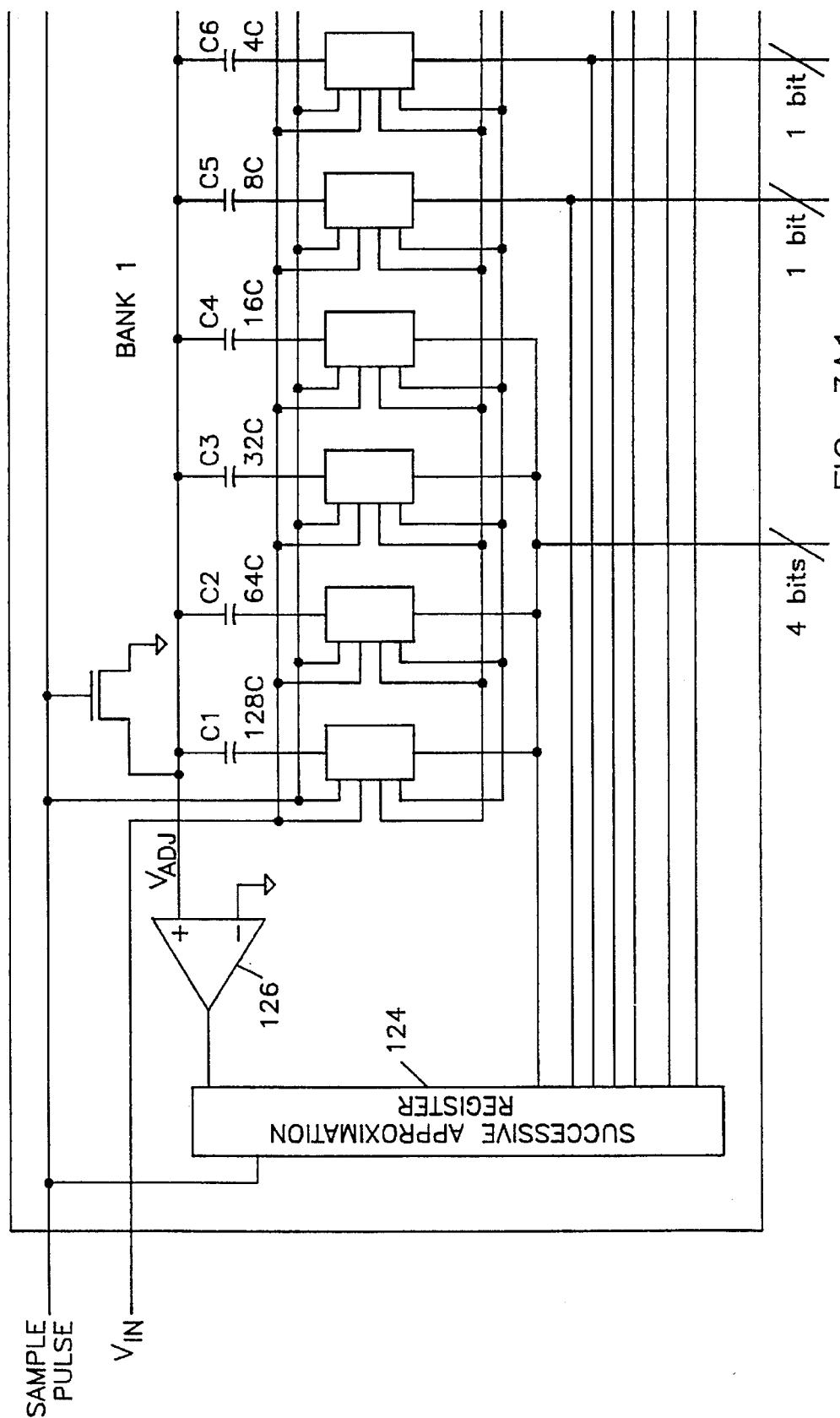
FIG. 3A1

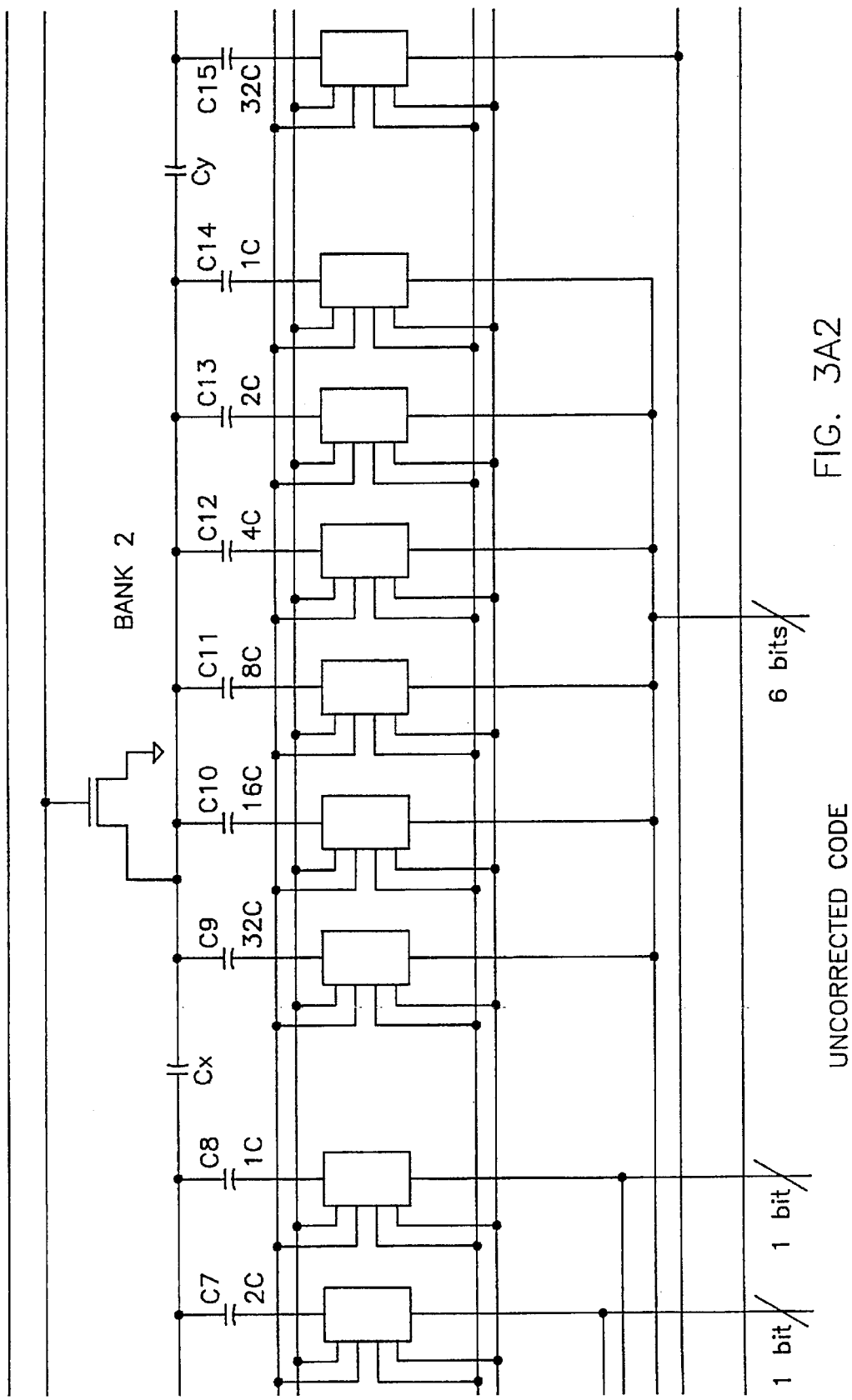
FIG. 3A2

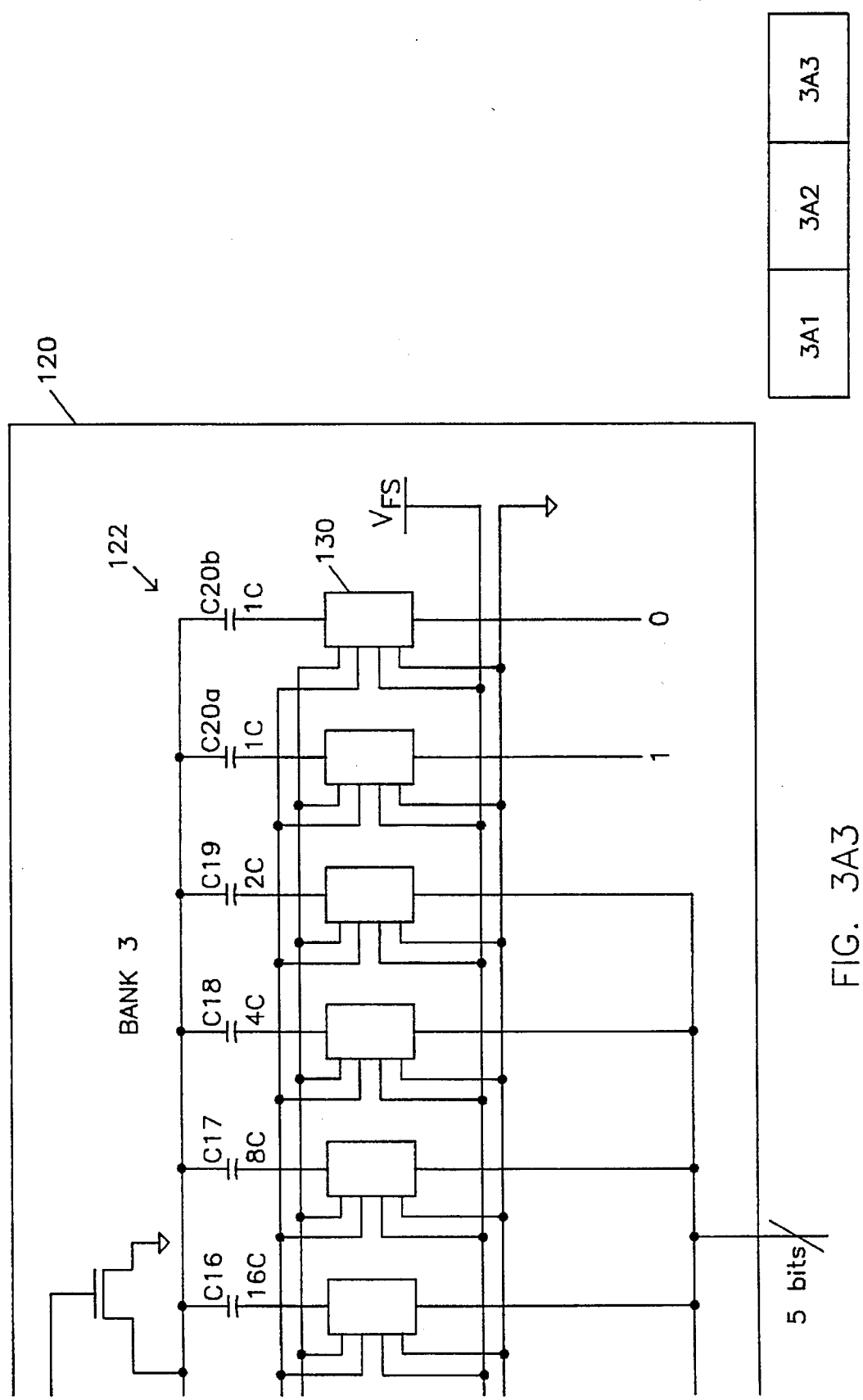
FIG. 3A3

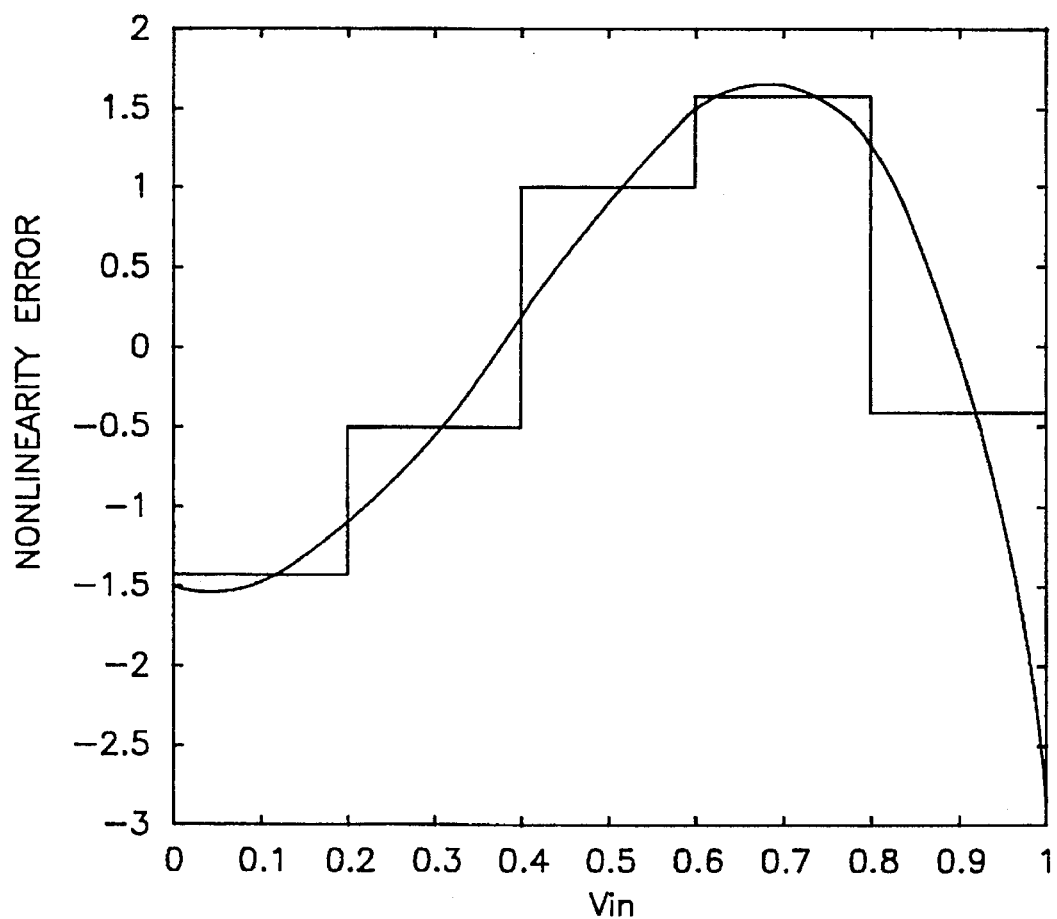

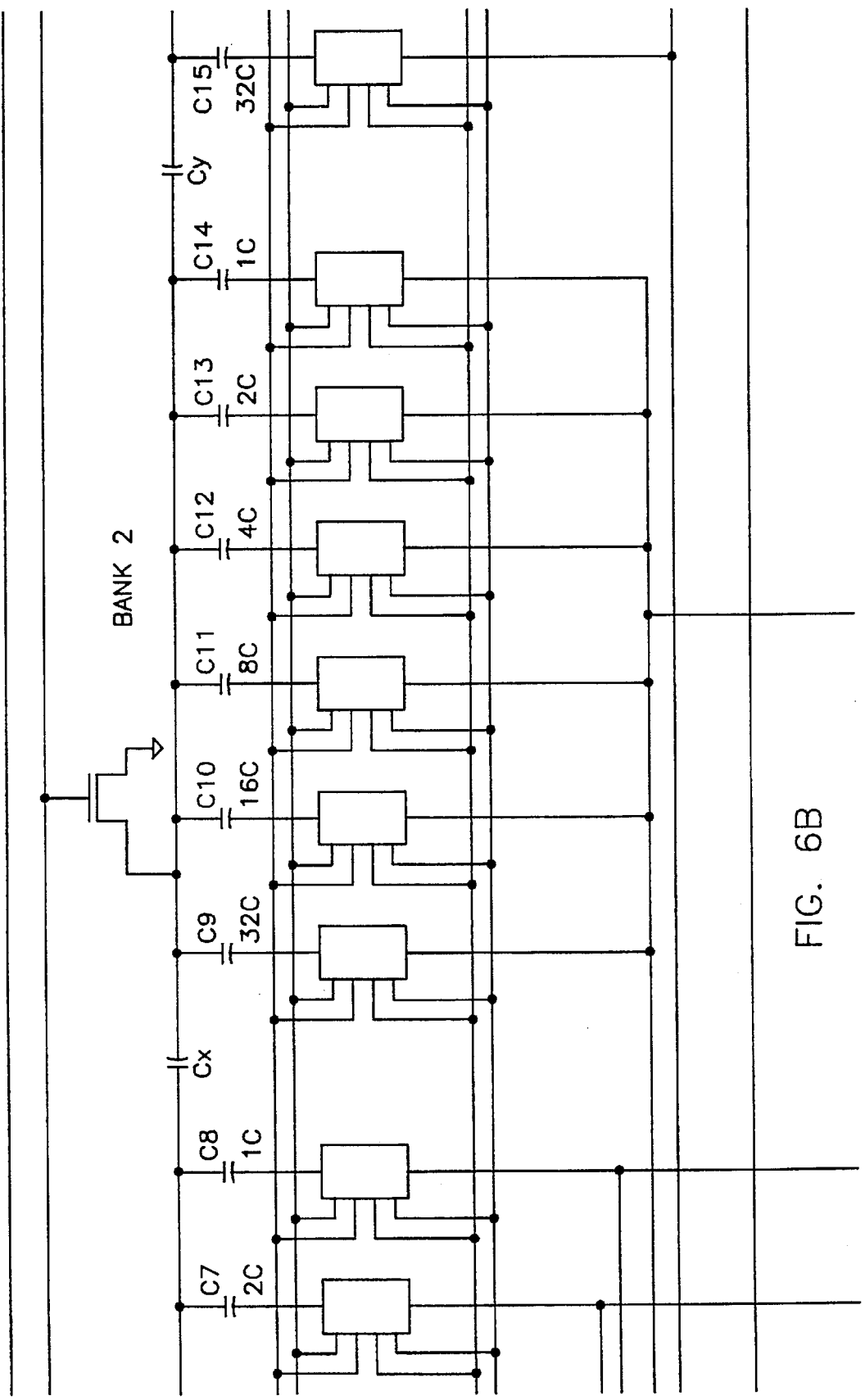

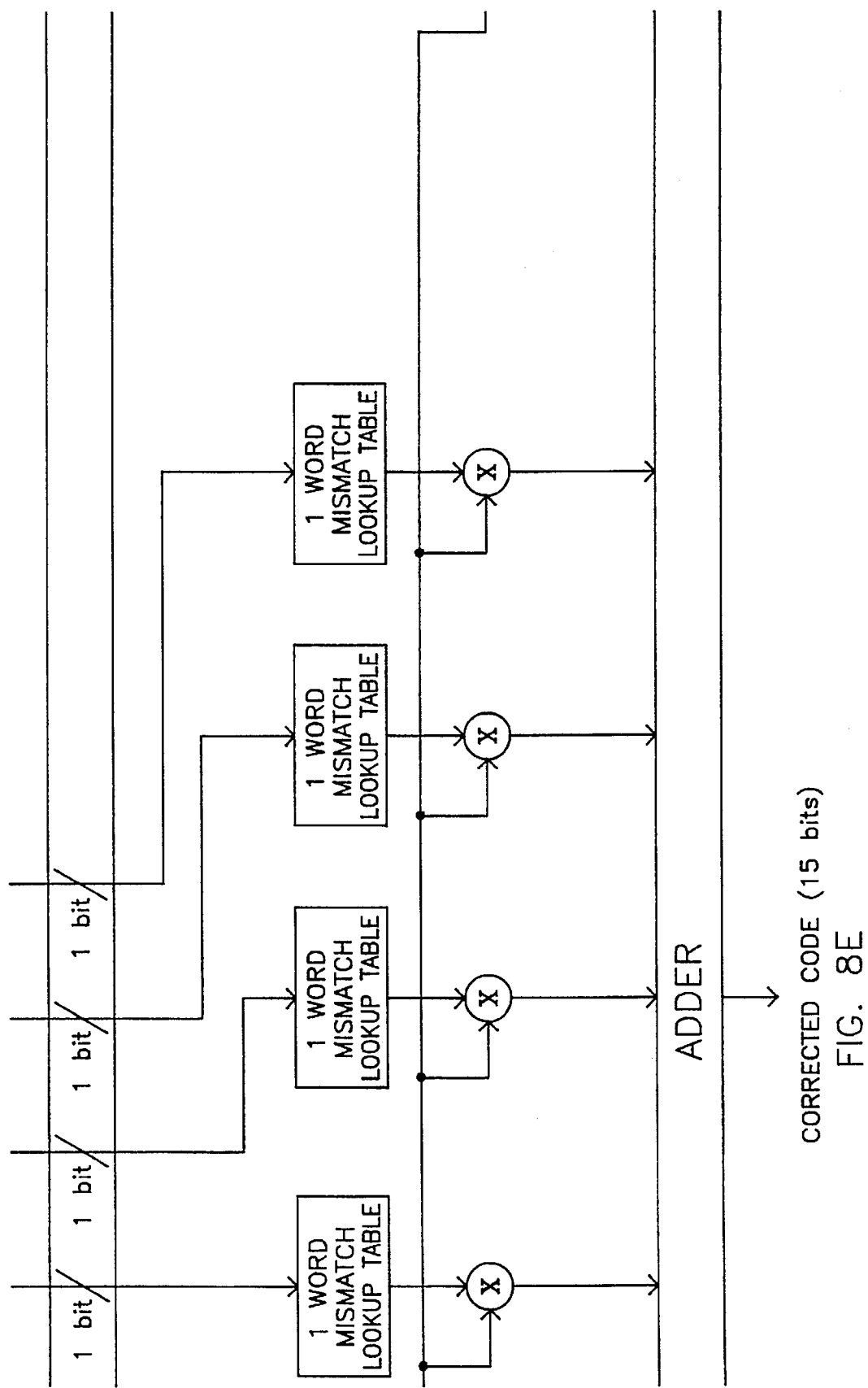

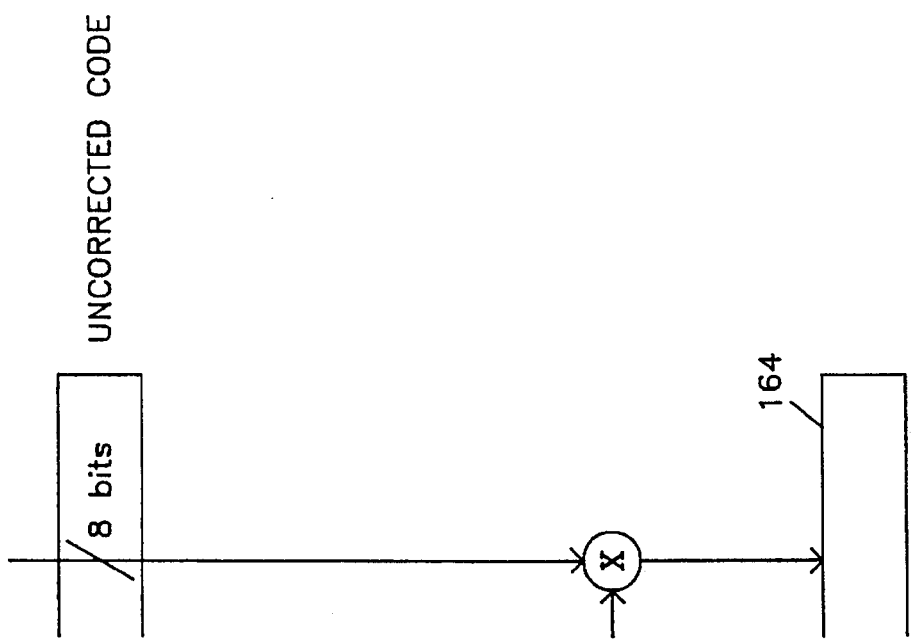

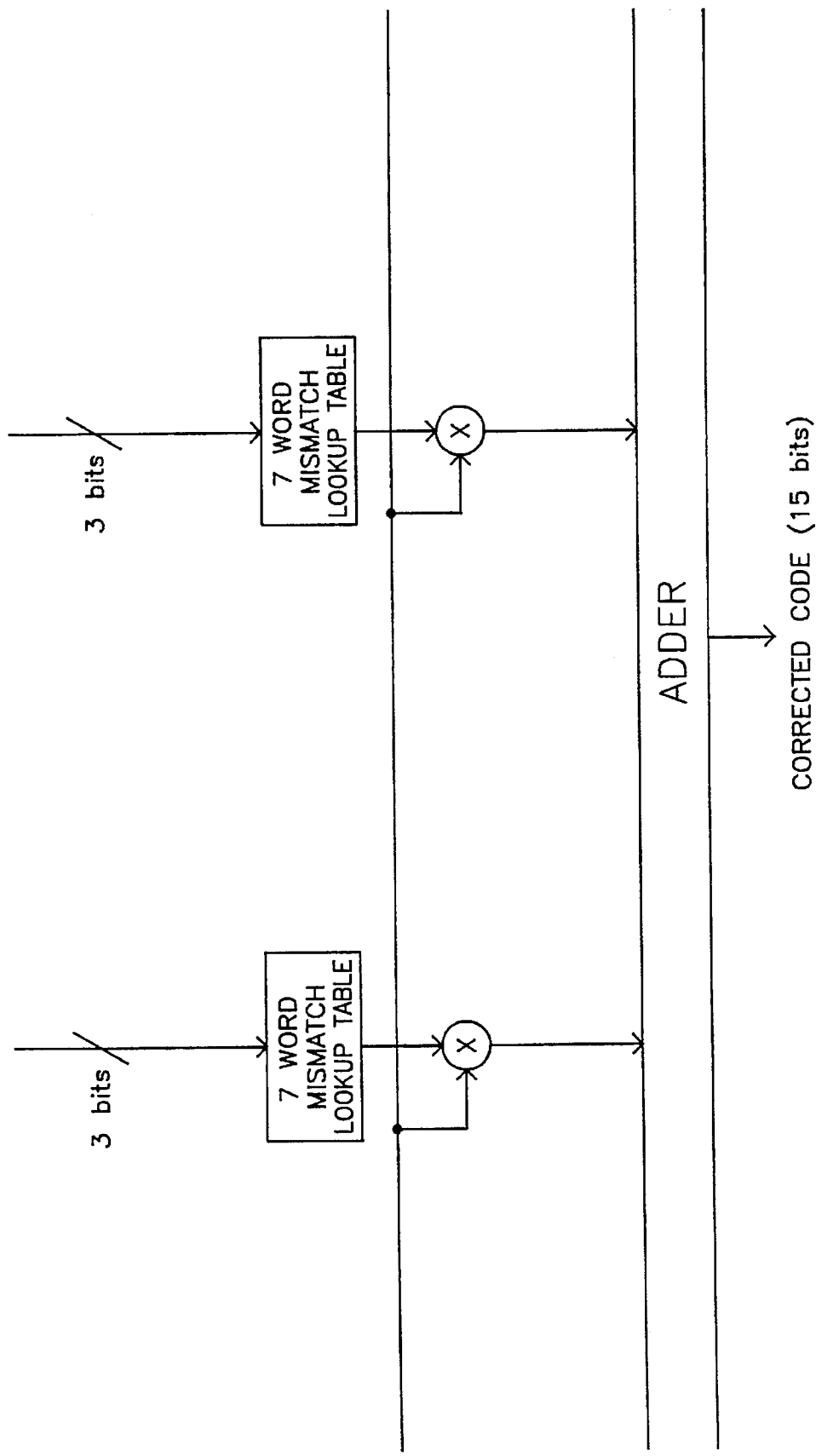

EFFICIENT ARCHITECTURE FOR CORRECTING COMPONENT MISMATCHES AND CIRCUIT NONLINEARITIES IN A/D CONVERTERS

This is a continuation of application Ser. No. 08/311,352 filed on Sep. 23, 1994 now abandoned.

BACKGROUND OF THE INVENTION

1. Field of the Invention.

The present invention relates to analog-to-digital (A/D) converters and, more particularly, to an A/D converter that corrects for both component mismatch and nonlinearity errors.

2. Discussion of the Related Art.

Analog-to-digital (A/D) converters rely on the values of components, typically resistors or capacitors, to form ratios that digitally represent the ratio of an input signal to a reference signal. As a result, the primary limitation on the accuracy that can be achieved with an A/D converter is the variation in the values of the components. This variation, known as component mismatch, causes these ratios to deviate from their nominal values which, in turn, produces errors in the digital representation of the input signal.

A switched-capacitor A/D converter architecture, for example, is typically limited in resolution to about 10–12 bits by mismatches between the capacitor values. Since applications are creating a demand for A/D converters with much greater accuracy, a number of methods have been devised for improving component matching or correcting the errors introduced by mismatches.

For example, components can be laser trimmed to improve the matching. This extra step, however, adds considerable cost to the fabrication process. Another approach, described in K. S. Tan, et al., "Error Correction Techniques for High-Performance Differential A/D Converters," IEEE J. Solid State Circuits, Vol. 25, No. 6, pp. 1318–1326, December 1990, is to store a digital correction signal, convert it to the analog domain, and then subtract the analog correction signal from the analog input signal. The disadvantage of this technique, however, is that it requires one or more extra digital-to-analog converters which consume additional power and die area.

Mismatch errors cause abrupt discontinuities in the input/output characteristic of an A/D converter, whereas nonlinearity errors, which are caused by the nonlinearity of the devices and circuits that are in the analog signal path, can be modeled as a continuous polynomial in the input signal with the terms of the polynomial decreasing in magnitude as the order of the terms increases. The first two terms (the constant and linear terms) can be interpreted as errors in the offset and gain of the device and are thus not important sources of error since they do not produce any distortion. Second-order and higher even-order nonlinearities can be approximately canceled by using a fully differential circuit architecture. Thus, the most important nonlinearity error will usually come from the third-order term.

In a typical switched-capacitor A/D converter, the third-order term limits the accuracy of the converter to about 13–14 bits. One technique for dealing with this error source utilizes an analog circuit to reproduce the third-order distortion to cancel it out. See R. Hester, at al., "Analog to Digital Converter with Non-linear Capacitor Compensation", 1989 Symposium on VLSI Circuits Dig. of Tech. Papers, pp. 57–58 and U.S. Pat. No. 4,975,700 to Tan, et al. The principal limitation to the Hester et al. approach is that this approach requires a significant amount of additional analog circuitry which, in turn, increases the cost and complexity of the converter. In addition, circuitry for removing the higher-order nonlinearities becomes increasingly difficult to design.

Another technique, described in U.S. Pat. No. 5,047,772 to Ribner, utilizes a digital memory to introduce an additive correction which is chosen based on a roughly quantized representation of the input signal. Several other independent digital memories are used to introduce corrections for component mismatches. This technique is able to correct for both component mismatch and circuit nonlinearity errors. The primary drawback of this technique is that it requires a much larger number of correction coefficients to be stored in a digital memory, which increases the area consumed by the error correction circuitry, and thus increases the cost and complexity of the analog-to-digital converter.

Another approach that has been used to increase the accuracy of A/D converters is described in U.S. Pat. No. 4,894,656 to Hwang et al. In this technique, a series of coefficients are stored representing the error at several different output codes of the A/D converter, and linear interpolation is used to determine an additive correction to the output code. While this technique is efficient in its utilization of memory, it is not able to correct for component mismatch errors since it is not possible to represent a discontinuous function using a linear interpolation technique.

SUMMARY OF THE INVENTION

The present invention provides a high-resolution analog-to-digital (A/D) conversion circuit that corrects for both component mismatches and circuit nonlinearities by utilizing look-up tables to store mismatch coefficients, which represent the component mismatch errors, as well as offset and gain coefficients, which are utilized to represent the nonlinearity errors.

A high-resolution A/D conversion circuit in accordance with the present invention includes a core A/D converter that continuously samples an analog input signal. The core A/D converter divides the maximum voltage range of the analog input signal into a plurality of intervals, determines which of the plurality of intervals bounds the sampled input signal, and then outputs an n-bit uncorrected code that uniquely identifies the interval that bounds the sampled input signal. The n bits of the uncorrected code are divided into a first r bits, an intermediate s bits, and a last t bits.

The nonlinearity error is represented by a polynomial which is approximated by using a series of $2^r$ line segments, each of which provides a linear representation of the nonlinearity error in one of $2^r$ different intervals. The first r bits identify the interval that bounds the sampled input signal. The aforementioned offset and gain coefficients are organized into an offset look-up table and a gain look-up table. The offset coefficient identifies the position of the line segment at the beginning of the interval, while the gain coefficient identifies the slope of the line segment within the interval. To implement this two-parameter piecewise-linear approximation, the offset look-up table receives the first r bits of the n-bit uncorrected code, and outputs a x-bit offset coefficient code. The gain look-up table simultaneously receives the first r bits of the n-bit uncorrected code, and outputs a y-bit gain coefficient.

The circuit further includes a plurality of mismatch look-up tables which are utilized to correct the component mismatch errors. Each mismatch look-up table receives one or more of the intermediate s bits of the n-bit uncorrected code, and outputs a z-bit mismatch coefficient. Each of the mismatch coefficients is then multiplied by the y-bit gain coefficient, using one of a plurality of mismatch multipliers, to produce a multiplied mismatch code that accounts for both mismatch and nonlinearity errors.

The conversion circuit additionally includes an end bit multiplier and an adder. The end bit multiplier receives the last t bits of the n-bit uncorrected code and multiplies the gain coefficient by the last t bits of the uncorrected code to produce a last code. The adder sums together the offset coefficient code, each of the multiplied mismatch codes, and the last code to produce a corrected code.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 3A1–3A3 and 3B are block diagrams illustrating the preferred embodiment of A/D converter 110.

FIGS. 5A–5D are graphical diagrams illustrating the approximation of the polynomial functional which represents the nonlinearity error.

FIG. 6A–6F are block diagram illustrating the preferred embodiment of the present invention.

FIG. 8A–8F are block diagram illustrating an alternative embodiment of the present invention in which A/D converter 110 utilizes a successive-approximation architecture based on a resistive ladder D/A converter.

FIG. 9A–9F are block diagram illustrating an alternative embodiment of the present invention in which A/D converter 110 utilizes a pipelined architecture.

DETAILED DESCRIPTION

Figure 1:
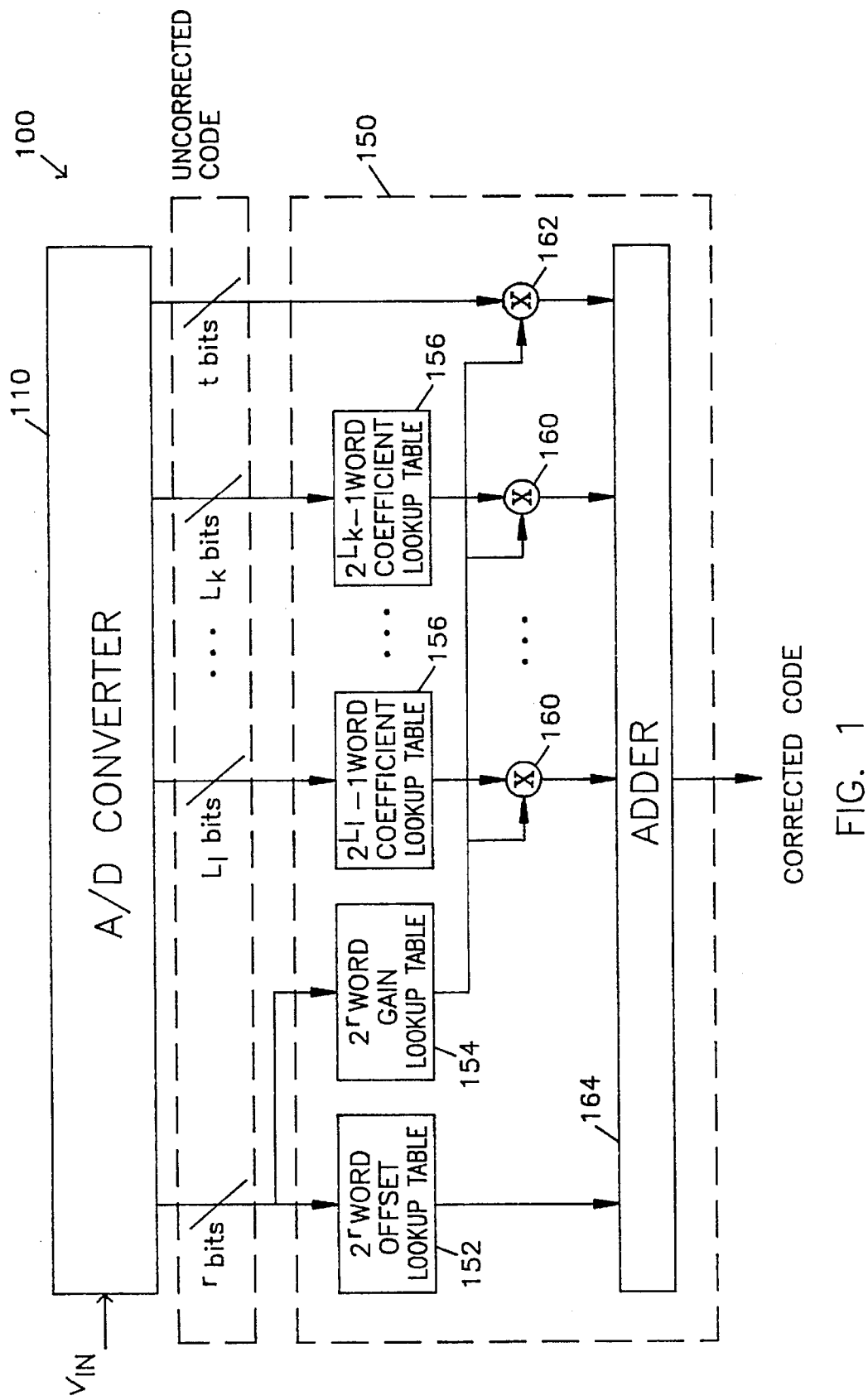
FIG. 1 is a block diagram illustrating an error-correcting analog-to-digital (A/D) conversion circuit 100 in accordance with the present invention.

FIG. 1 shows a block diagram that illustrates a high-resolution, error-correcting analog-to-digital (A/D) conversion circuit 100 in accordance with the present invention. As described in greater detail below, A/D conversion circuit 100 provides greater resolution and accuracy by utilizing the bits of the code output by an A/D converter to address a series of look-up tables which contain offset, gain, and component mismatch coefficients. The component mismatch coefficients are then multiplied by the gain coefficients and added to the offset coefficients to produce a corrected code which is a more accurate representation of the input signal than the uncorrected code.

As shown in FIG. 1, circuit 100 includes a core A/D converter 110 that continuously samples an analog input signal $V_{IN}$, and converts the voltage of each sampled input signal into an n-bit uncorrected code which represents the voltage of the sampled input signal. As is well known, A/D converters operate by breaking the voltage range of the sampled input signal into a series of intervals, and then assigning a digital code to each interval. In the present invention, converter 110 can be implemented with any conventional A/D converter which can uniquely identify each interval.

As described in greater detail below, the accuracy of converter 110 is limited by non-idealities, including component mismatch and nonlinearity errors. These non-idealities, in turn, alter the functional relationship between the voltage of the sampled input signal and the codes output from the converter.

Figure 2A:
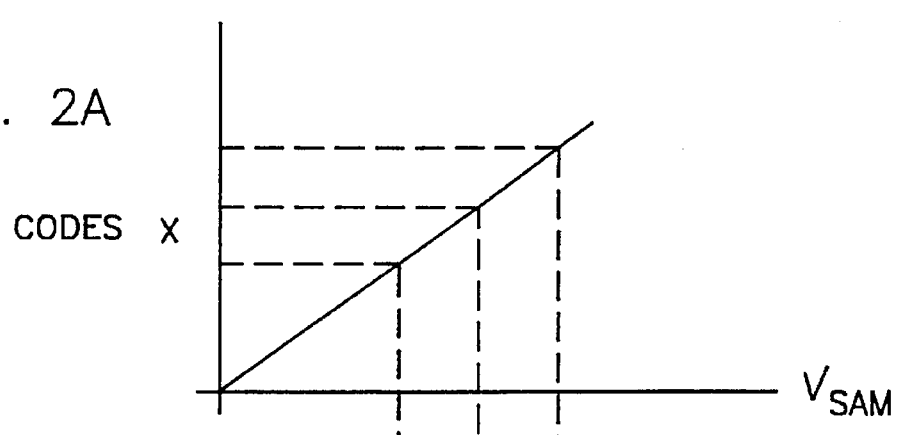
FIGS. 2A–2C are graphical diagrams illustrating the functional relationship between the sampled input signal and the uncorrected codes.

FIG. 2A shows a graphical diagram that illustrates the ideal functional relationship between a sampled input signal $V_{SAM}$ and the uncorrected codes. As shown in FIG. 2A, the relationship between the sampled input signal $V_{SAM}$ and the output codes of an A/D converter is ideally a linear function. As a result, each output code uniquely identifies only one voltage increment. Thus, as shown in FIG. 2A, code X uniquely identifies voltage increment Y.

Figure 2B:
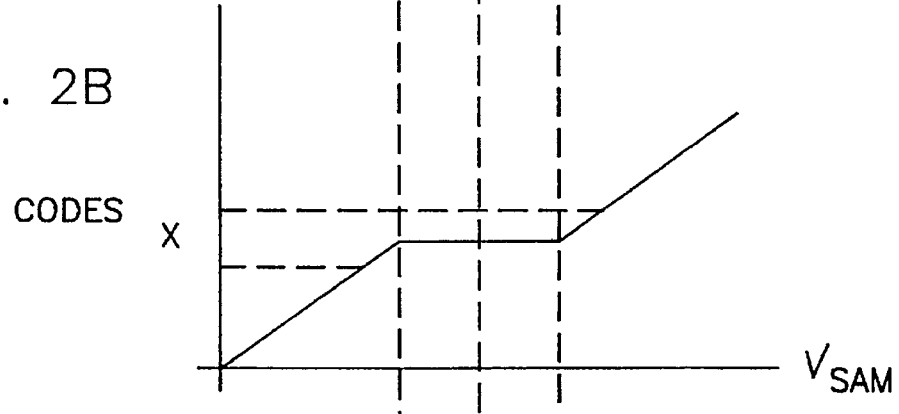

In actual practice, however, the component mismatch errors associated with an A/D converter often produce a function, as shown in FIG. 2B, where two or more voltage increments are identified by the same output code.

As described in greater detail below, the present invention digitally adds together a series of correction codes, which compensate for the mismatch and nonlinearity errors, to produce a corrected code. When this type of digital approach is utilized and two or more voltage increments are identified by the same output code, it is impossible to identify which of the intervals are represented by this code. As a result, the accuracy of the corrected code cannot be maintained.

Figure 2C:
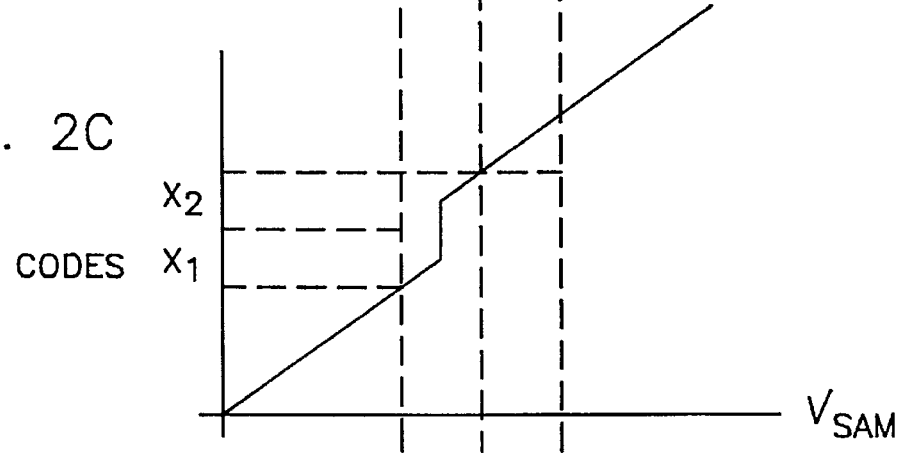

To avoid this situation, the core A/D converter 110 must be designed so that the converter has a sufficiently high code density over the entire full-scale input range regardless of any component mismatches or nonlinearities. This is accomplished by introducing a deliberate overlap in the input signal intervals represented by different codes. FIG. 2C shows a graphical diagram that illustrates the functional effect of increasing the code density. In the diagram, codes $x_1$ and $x_2$ represent the same interval y.

In the preferred embodiment, A/D converter 110 is implemented as a charge-redistribution successive-approximation A/D converter 120, as shown in FIGS. 3A1–3A3. As described in further detail below, A/D converter 120 utilizes a capacitor array 122 to store a charge which represents a sampled version of the input signal. Successive-approximation register 124 is used to incrementally adjust the charge stored on the capacitor array, and comparator 126 is used to compare the incrementally-adjusted signal to a reference voltage, shown as ground in FIG. 3A1–3A3. The result of each comparison is used by the successive-approximation register 124 to define the logical state of one bit in the uncorrected code.

In operation, capacitor array 122 functions as a voltage divider such that when a change equal to the full-scale voltage $V_{FS}$, i.e., the maximum voltage of the analog input signal $V_{IN}$, is applied to the bottom plate of capacitor C1, a change of approximately one-half of the full-scale voltage $V_{FS}$ appears on the top plate of capacitor bank 1. When the bottom plate of capacitor C2 is changed by the full-scale voltage VFS, a change of approximately one-quarter of the full-scale voltage $V_{FS}$ appears on the top plate of capacitor bank 1. Similarly, when the bottom plate of capacitor C3 is changed by the full-scale voltage VFS, a change of approximately one-eighth of the full-scale voltage $V_{FS}$ appears on the top plate of capacitor bank 1.

Figure 4A:
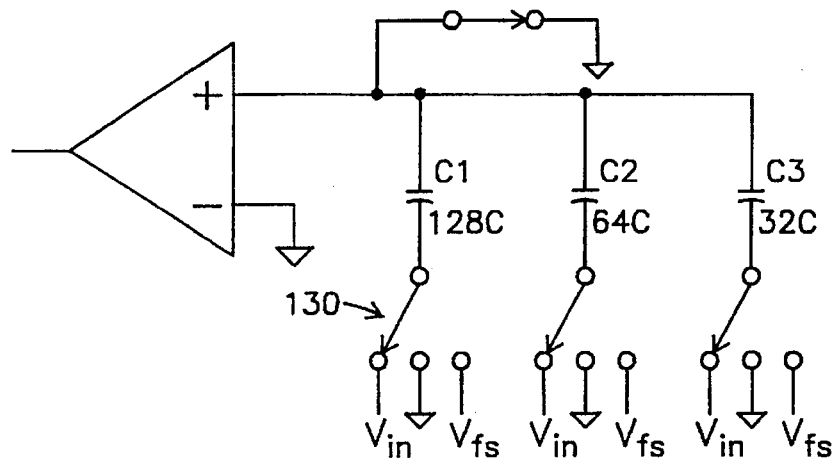
FIGS. 4A–4C are schematic diagrams illustrating the operation of capacitor array 124.
Figure 4B:
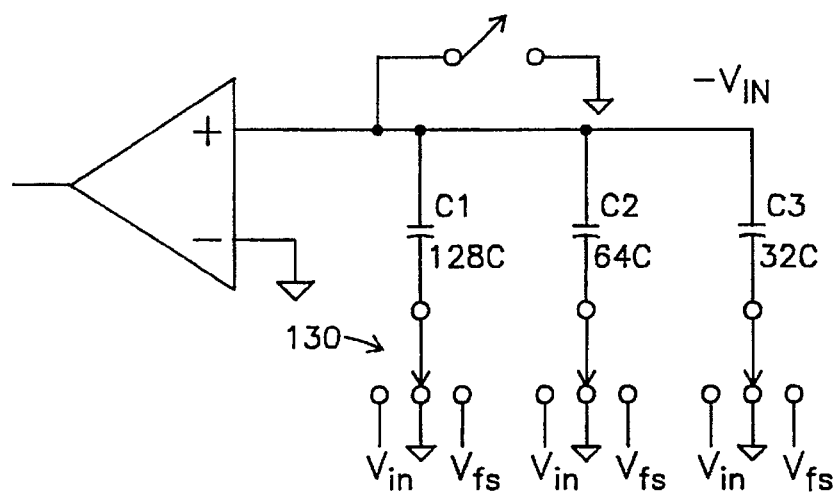
Figure 4C:
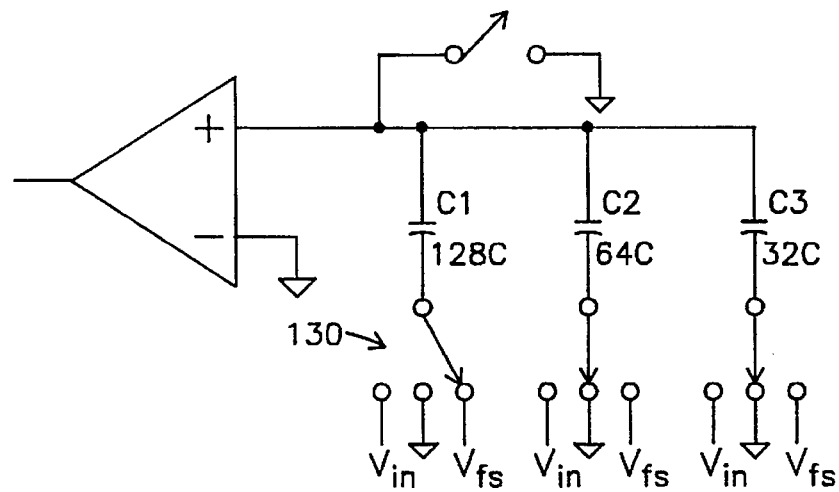

FIGS. 4A–4C show schematic diagrams that illustrate the operation of capacitor array 122. As shown in FIG. 4A, each time the analog input signal $V_{IN}$ is sampled, the top plate of each capacitor in the array is connected to ground, while the bottom plate of each capacitor is connected to the input signal $V_{IN}$ through a three-position electronic switch 130. This step causes the voltage of the input signal $V_{IN}$ to appear across each of the capacitors.

Next, as shown in FIG. 4B, the top plate of each capacitor array is disconnected from ground and left floating. Then, after a short delay, the bottom plate of each capacitor is connected to ground. These steps cause the voltage of the input signal VIN to be sampled and to appear on the top plates of the capacitors as a negative voltage $-V_{IN}$.

Figure 3B:
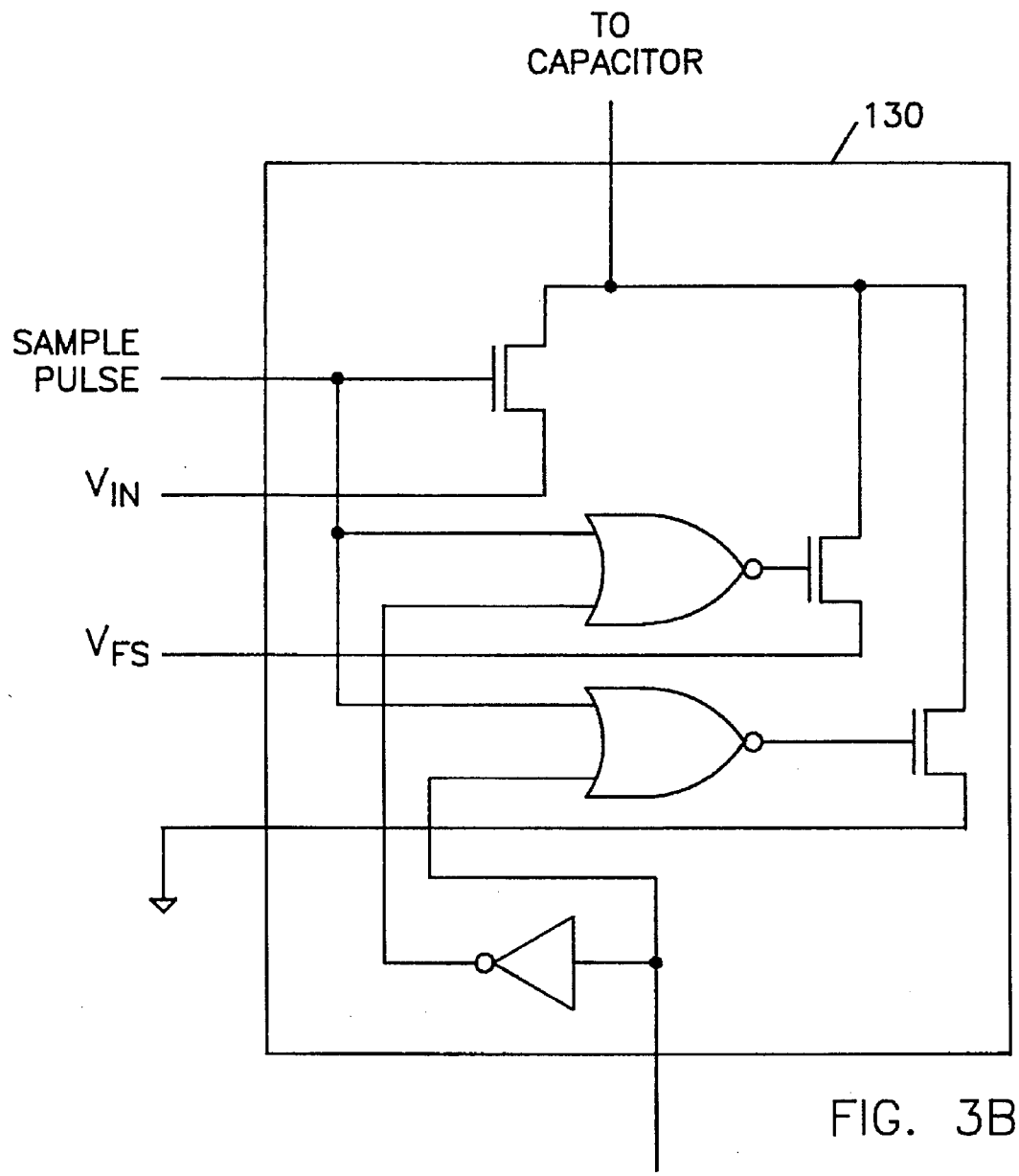

Following this, successive-approximation register 124 outputs a series of codes which sequentially connect the bottom plate of each capacitor to the full-scale voltage $V_{FS}$. Thus, register 124 would initially output a 1000 0000 0000 0000 000 code. The one in the first bit position causes the bottom plate of capacitor C1 to be switched to the full-scale voltage $V_{FS}$, as shown in FIG. 4C. As described above, this causes a change of approximately one-half of the full-scale voltage $V_{FS}$ to appear on the top plate. FIG. 3B is a schematic diagram showing the detail of threeposition switch 130. The switching elements are indicated as NMOS transistors, but a complementary pair of transistors could also be used.

Thus, for example, if the voltage of the input signal VIN is 3.5 volts and the full-scale voltage $V_{FS}$ is 5.0 volts, then a negative 3.5 volts would be present at the top plates of the capacitors as shown in FIG. 4B. When register 124 outputs the code which switches the bottom plate of capacitor C1 to the full-scale voltage $V_{FS}$ or 5.0 volts, then the top plate of capacitor C1 increases by approximately 2.5 volts. As a result, the differential input to comparator 126 is a negative 1.0 volts (2.5–3.5) since the reference voltage is ground. Thus, the output of comparator 126 indicates that the measured voltage is less than zero.

Following this, register 124 outputs a 1100 0000 0000 0000 000 code. The one in the first position is retained since the result of the comparison indicates that the successive approximation voltage $V_{ADJ}$ is less than zero. The one in the second bit position causes the bottom plate of capacitor C2 to be switched to the full-scale voltage $V_{FS}$ which, in turn, causes one-quarter of the full-scale voltage $V_{FS}$ or 1.25 volts to appear on the top plate of capacitor C2. As a result, the input to comparator 126 is now a positive 0.25 volts (2.5+ 1.25–3.5). In this case, the output of comparator 126 indicates that the measured voltage is greater than zero.

As a result, register 124 resets the second bit position to zero and outputs a 1010 0000 0000 0000 000 code. The one in the second bit position, in this case, is not retained since the result of the comparison indicates that the successive approximation voltage $V_{ADJ}$ is greater than zero. The zero in the second bit position causes the bottom plate of capacitor C2 to be switched back to ground, while the one in the third bit position causes the bottom plate of capacitor C3 to be switched to the full-scale voltage $V_{FS}$. This step causes the input of comparator 126 to be a negative voltage of 0.375 (2.5+0.625–3.5). The process then continues as described above until all but the last two capacitors of the array of FIG. 1 have been utilized. The last two capacitors are used to terminate the capacitor array in such a way that the transition point for the first code occurs at an input signal level different from zero, which reduces the noise produced by the A/D converter in its quiescent state.

If the values of the capacitors in the array are chosen so that they increase in accordance with a binary geometric progression (1, 2, 4, 8, . . . ), then mismatches between capacitor values will cause an A/D converter with more than 10 to 12 bits of resolution to be subject to regions where the code density is not sufficient to resolve the input signal. In order to guarantee that the code density meets the requirements previously discussed so that the required accuracy in the corrected code can be obtained, the individual capacitors must be set according to a radix less than two. To maintain good matching between the capacitors, however, it is also desirable that their values be integer multiples of some unit capacitance. A charge redistribution array with non-binary weights can be implemented using a technique for dividing up a capacitor array into banks which is presented in H. Ohara, et al., "A CMOS Programmable Self-Calibrating 13-bit Eight-Channel Data Acquisition Peripheral," IEEE J. Solid State Circuits, Vol. 22, No. 6, pp. 930–937, December 1987.

As shown in FIGS. 3A1–3A3, capacitor array 122 is broken into three banks of capacitors which are coupled together by coupling capacitors $C_x$ and $C_y$. If the coupling capacitors are set to $^{64}/_{63}C$, the entire array exhibits a binary weighting. By increasing the first coupling capacitor $C_x$ above this value, the weight of the low-order bits is increased and the weight of the highorder bits is decreased. As a result, adequate code density is maintained when the capacitors deviate from their nominal values.

Referring again to FIG. 1, circuit 100 also includes an error correcting circuit 150 that generates a p-bit corrected code for each n-bit uncorrected code. The corrected codes are first determined by utilizing the bits of the uncorrected code to address a series of look-up tables.

As shown in FIG. I, the first r bits of the uncorrected code are utilized to address an offset look-up table 152 and a gain look-up table 154, while the next s bits, which are further subdivided into groups of $L_1, L_2, \ldots L_k$ bits, are utilized to individually address a series of mismatch look-up tables 156.

The coefficients which are stored in the mismatch look-up tables 156 represent the correction coefficients which are necessary to compensate for component mismatch errors produced in the components used to generate the middle s bits of the uncorrected code. Component mismatch errors are the errors which are introduced by variations in the value of the components, such as the capacitors in the array 124.

The coefficients which are stored in the offset and gain look-up tables 152 and 154 represent the correction coefficients which are necessary to compensate for nonlinearity errors. Nonlinearity errors are the errors which are introduced by the voltage coefficients of the capacitors and resistors in the A/D converter, and by nonlinearities in the active circuitry (e.g., comparators, op-amps) of the converter.

In the preferred embodiment, the first four bits (r=4) of the uncorrected code are utilized to address look-up tables 152 and 154, while each of the next four bits are utilized to address four individual mismatch look-up tables 156 (L1=1 bit, L2=1 bit, L3=1 bit, and L4=1 bit).

A better appreciation of the functioning of the invention will be obtained from the following discussion of the nature of component mismatch errors and nonlinearity errors.

For many A/D converter architectures, the converter is divided up into sections or stages and the error introduced by component mismatches in each section or stage is independent of the error introduced in the other sections or stages. In a converter with such an architecture, the error introduced by component mismatches can be modeled as a simple function of the code which is output from the A/D converter 110 as:

$$\epsilon_{mismatch} = \sum_{j=1}^{m} E_j(b_j) \qquad \text{EQ. 1}$$

where $b_j$ represents the value of the bits of the uncorrected code which are produced by the jth section or stage, and the function $E_j$ represents the error caused by mismatches in the components associated with the jth section or stage. The number of sections or stages in the A/D converter is represented by m.

In the case of the preferred embodiment, the component mismatch error introduced by each of the capacitors in the array makes an independent contribution to the overall error of the A/D converter. In addition, a single bit of the uncorrected code is associated with each capacitor. The error produced by component mismatches in A/D converter 120 can thus be expressed as:

$$\epsilon_{mismatch} = E_0 + \sum_{j=1}^{n} E_j b_j \qquad \text{EQ. 2}$$

where $b_j$ represents the jth bit of the uncorrected output code, which has a value of either 1 or 0, and $E_j$ is the error caused by mismatches in the capacitor associated with bit j. $E_0$ represents the error produced by component mismatches when all of the bits in the uncorrected code are zero. Thus, for example, if the corrected code 1001 0000 0000 0000 000 is produced, the error associated with the first and fourth bit positions is added together, so $\epsilon_{mismatch} = E_0 + E_1 + E_4$.

Figure 5A:
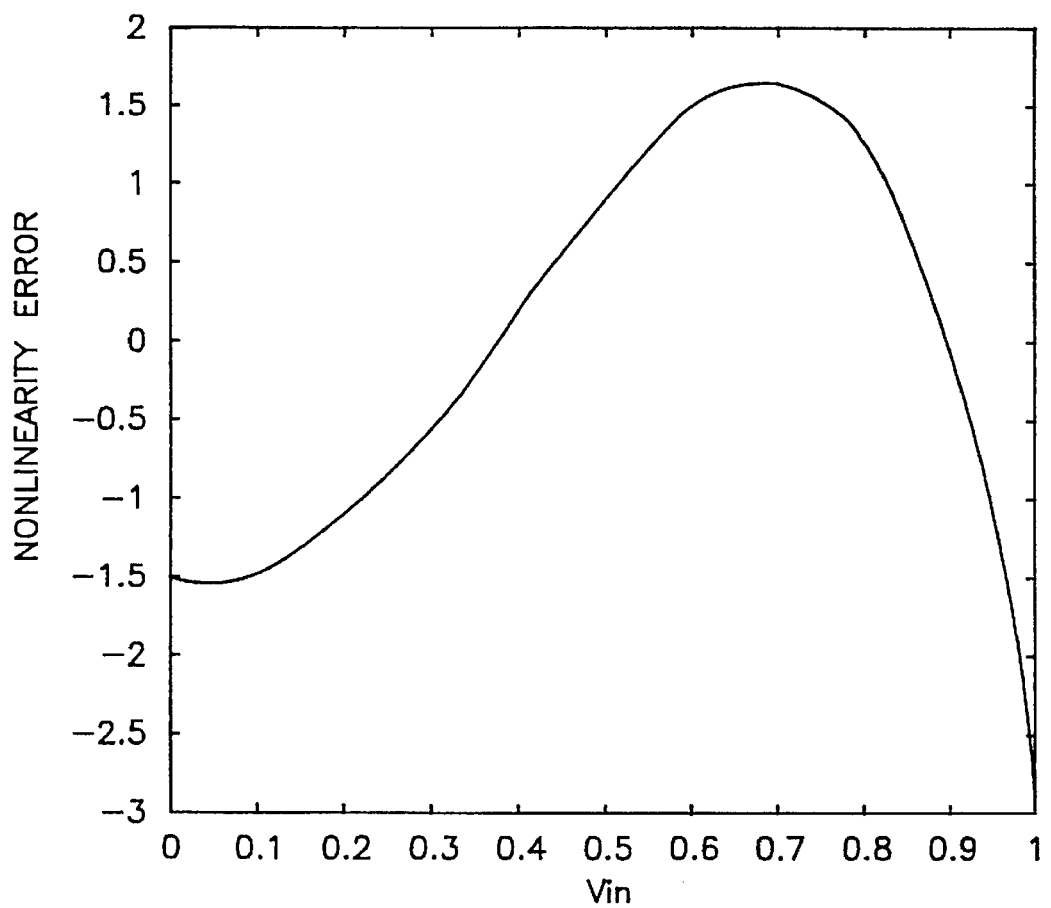

While component mismatch error often changes abruptly as a result of a small change in the input signal, the nonlinearity error is a smooth function of the input signal, as shown in FIG. 5A. The nonlinearity error can thus be modeled as a polynomial in the input signal $\Phi$:

$$\epsilon_{nonlinearity} = \sum_{i=2}^{r} a_i \phi^i \qquad \text{EQ. 3}$$

Good agreement between the model and the circuit can be obtained with a low order polynomial ($3 \leq r \leq 5$).

A greater appreciation of the invention will be achieved by considering several possible methods of calculating the nonlinearity error in order to introduce it as a correction.

First, an estimate of the input signal $\Phi$ in needed to calculate $\epsilon_{nonlinearity}$ and introduce it as a correction, but the accuracy of the $\Phi$ value used is not important since if the value used for $\Phi$ is off by an amount of the order of $\delta$, then the error estimate $|\epsilon_{n1}(\Phi+\delta) - \epsilon_{n1}(\Phi)|$ will be off set by an amount of the order of $\delta^2$. As described in further detail below, the code that the present invention utilizes to perform the nonlinearity correction is a partially corrected code from which mismatch errors have been removed.

To determine the nonlinearity error, the polynomial in EQ. 2 could be calculated explicitly, but this would require a large number of multiplications, which would lead to an inefficient implementation. Instead, the full-scale input range can be divided up into a small number of intervals and a simple approximation can be made for the polynomial within each interval.

Figure 5C:
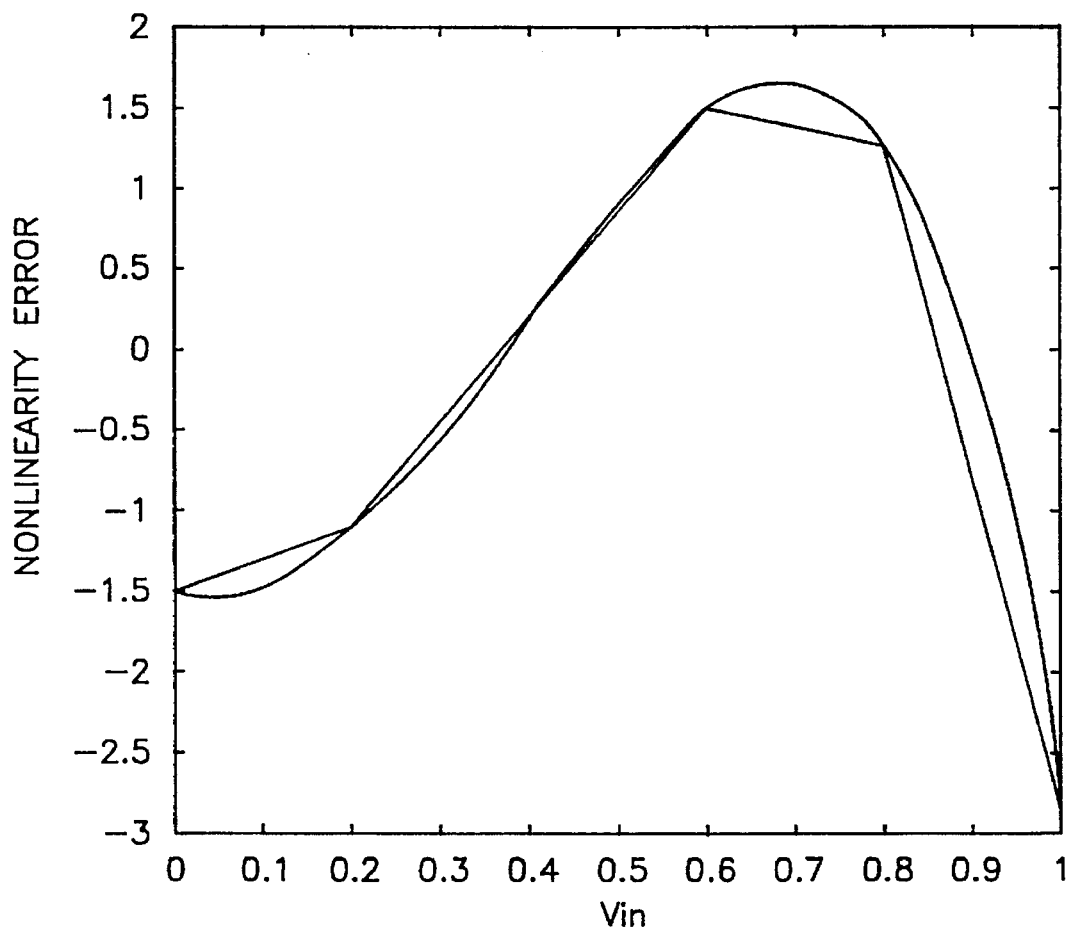
Figure 5D:
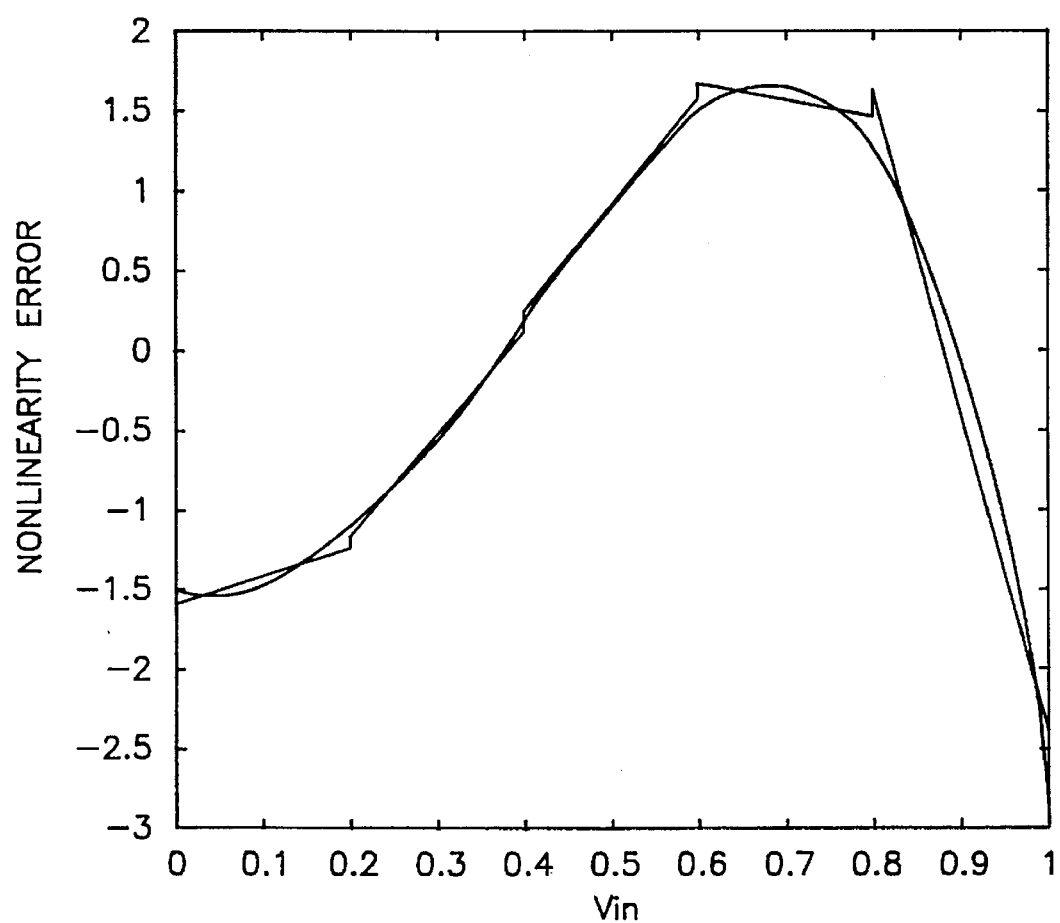
Figure 6A:
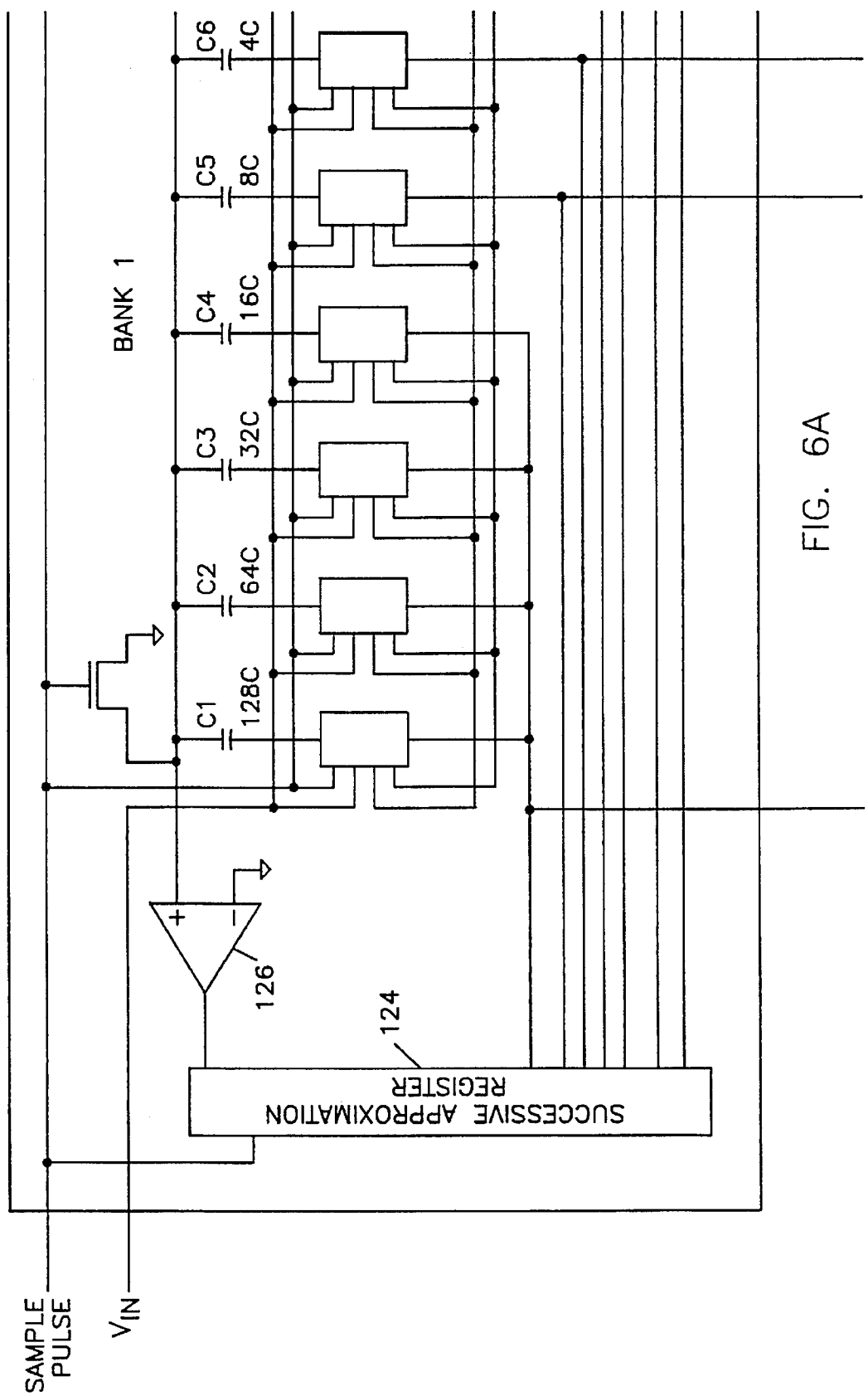
Figure 6C:
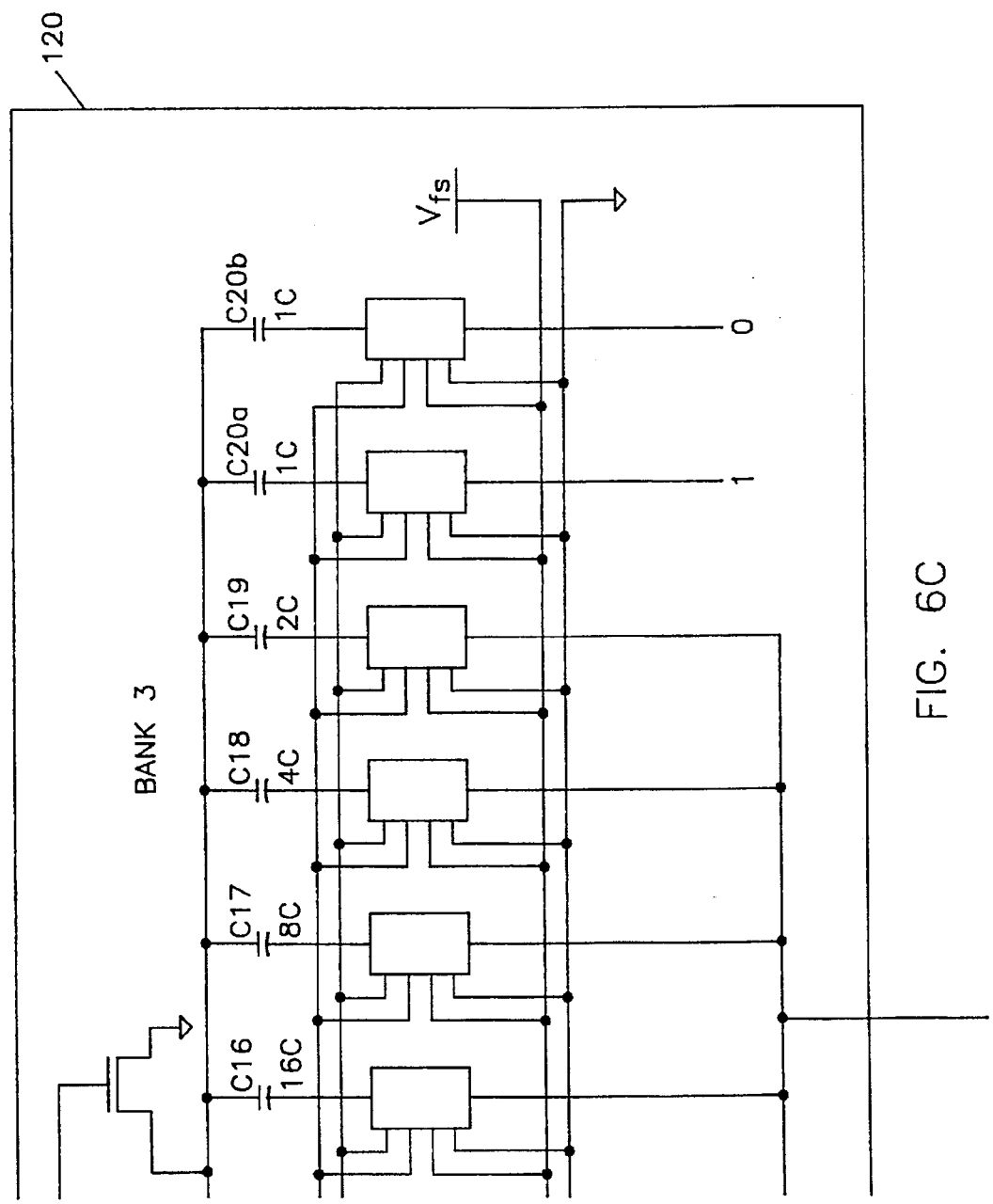
Figure 6D:
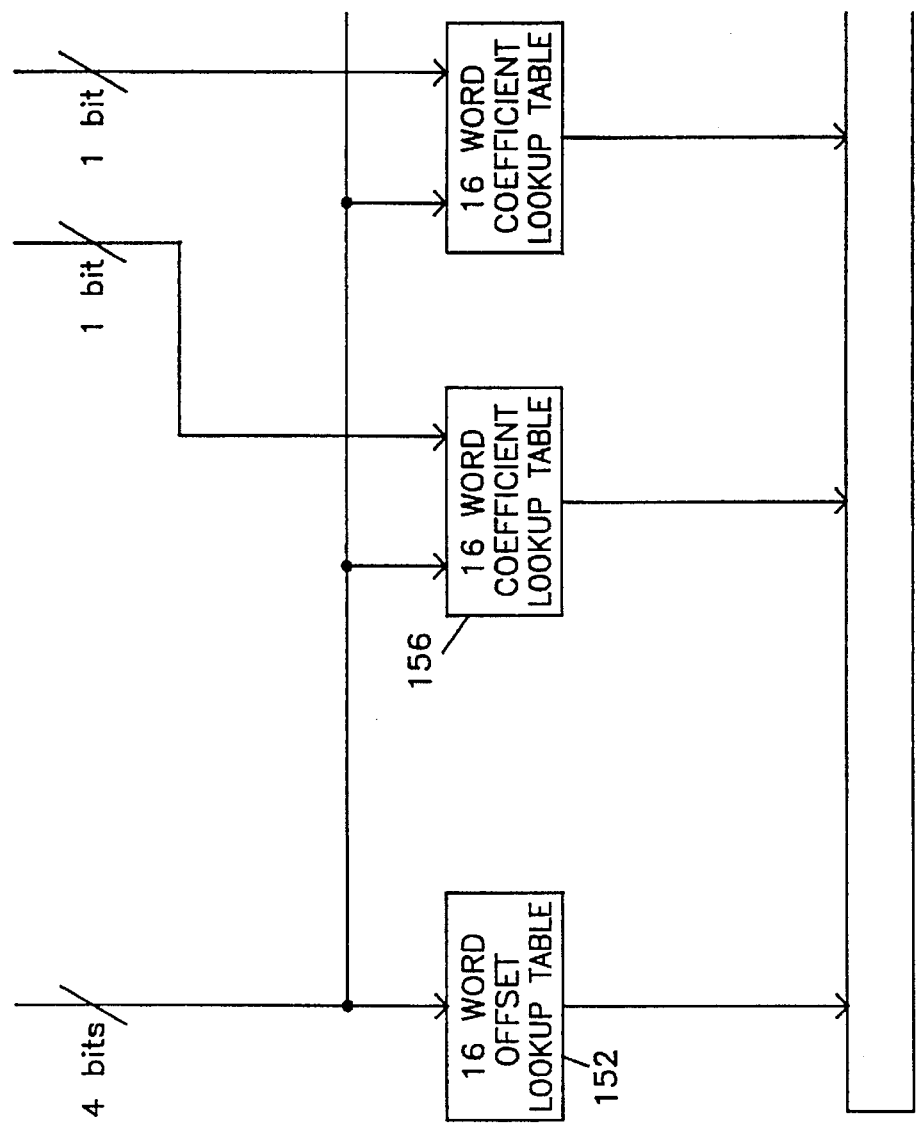
Figure 6E:
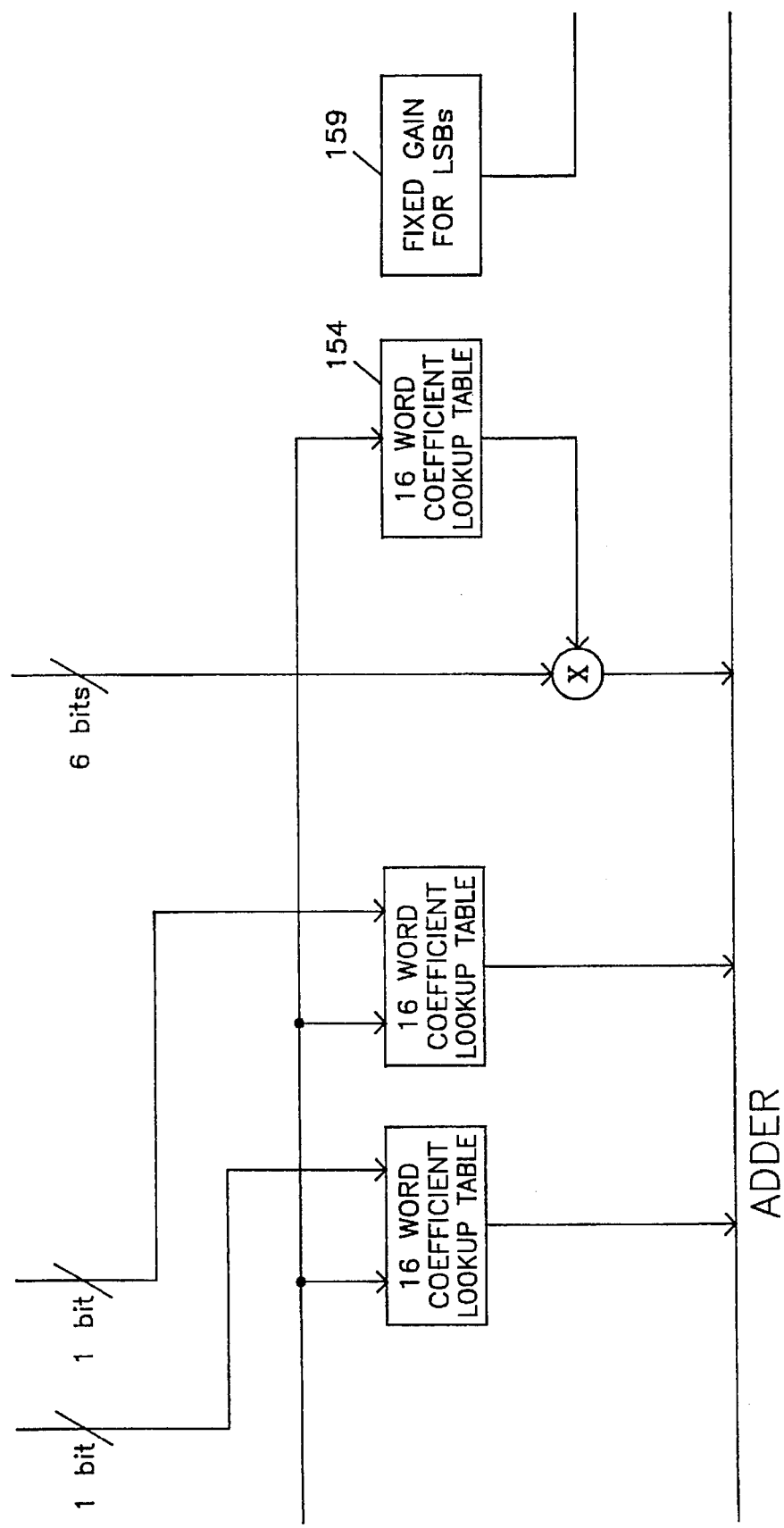
Figure 6F:
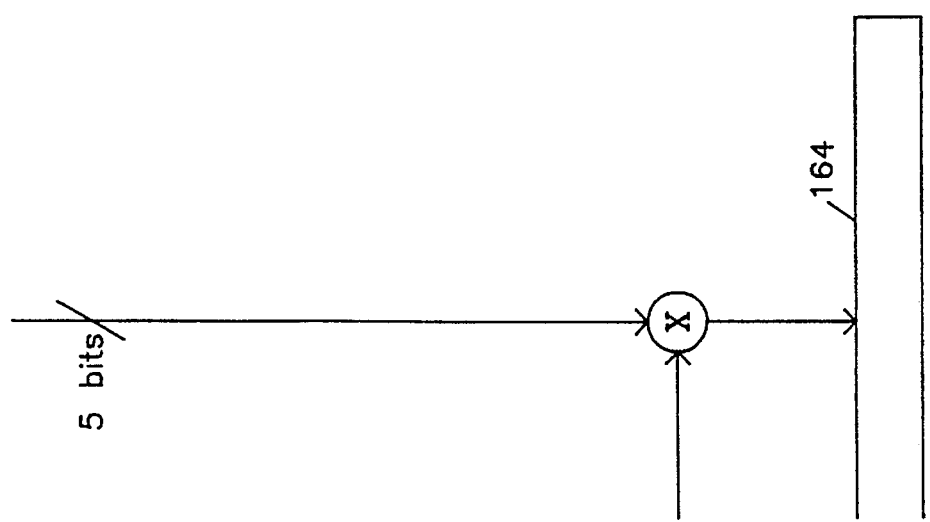

The approximation used within each interval could simply be a fixed value, such as the average of the polynomial over the interval, as shown in FIG. 5B, or linear interpolation could be used between the interval endpoints, as shown in FIG. 5C. In the present invention, a two-parameter linear fit is used so that both endpoints of the segment which is used to approximate the polynomial within an interval can be independently chosen, as shown in FIG. 5D. For the two-parameter fit, the function is modeled within the interval as:

$$\frac{i}{N} \leq \phi < \frac{i+1}{N} \qquad \text{EQ. 4}$$

as $$\epsilon_{nonlinearity}(i) = A(i) + G(i)\phi \qquad \text{EQ. 5}$$

where $A_i$ and $G_i$ are respectively the intercept and the slope of the line segment best fitted to the error profile within the interval i.

The worst-case error introduced by these approximations is roughly proportional to $1/N$ for the piecewise-constant model or $1/N_2$ for the piecewise linear model and the two-parameter model, where N represents the number of segments used in the approximation. Table 1 shows the proportionality constant as it depends on the order of the polynomial.

TABLE 1

Piecewise-linear approximations of polynomials

WORST-CASE ERROR $$\left( \frac{\|f - f_{pw}\|_\infty}{\|f\|_\infty} \right)$$

FOR LARGE n

| | 2nd Order | 3rd Order | 4th Order | 5th Order |
|---|---|---|---|---|
| Piecewise-constant model | $\frac{3}{N}$ | $\frac{6}{N}$ | $\frac{10}{N}$ | $\frac{15}{N}$ |
| Piecewise-linear model & two-parameter model | $\frac{1}{N^2}$ | $\frac{5}{N^2}$ | $\frac{15}{N^2}$ | $\frac{35}{N^2}$ |

The two-parameter model does not provide a significant advantage over the piecewise-linear model in the accuracy with which a polynomial can be modeled, but it allows the model to accommodate discontinuities in the error function. The discontinuities can be used to simply the error correction hardware by including the component mismatch error for the first r bits, as discussed below.

In the preferred embodiment, the full-scale input range is divided into 16 intervals and two parameters are used for each interval. The resulting approximation can represent third-order nonlinearities with 2% accuracy, so the distortion they cause in the worst case is reduced from −72 dB to −106 dB (0.6 LSB).

If the expression for the component mismatch error given in EQ. 2 and the approximations for the nonlinearity error given in EQ. 5 are combined, one obtains:

$$\epsilon_{total} = \left[ \sum_{j=1}^{m} E_j(b_j) \right] + A(i) + G(i) \left[ x - \sum_{j=1}^{m} E_j(b_j) \right] \qquad \text{EQ. 6}$$

where $E_j$ represents the component mismatch error associated with the jth section or stage. In EQ. 6, the coefficient multiplied by $G(i)$ is the partially corrected code in which component mismatch errors have been subtracted from the uncorrected code. $A(i)$ and $G(i)$ represent the slope and intercept parameters for the segment of the piecewise linear approximation corresponding to the interval in which the input signal falls.

To understand how the error correction architecture shown in FIG. 1 corrects for the errors expressed in EQ. 6, some algebraic manipulations of this equation will be presented. The desired corrected code, in which both mismatch and nonlinearity errors have been subtracted from the uncorrected code, can be found by using EQ. 6 to be equal to the following summation:

$$x - \epsilon_{total} = -A_i + (1 - G_i) \sum_{j=1}^{m} [2^{B_j} b_j - E_j(b_j)] \quad \text{EQ. 7}$$

where $2^{B_j} B_j$ represents the value of the bits produced by the jth section or stage, weighted according to their position in the uncorrected code, so that the sum of these terms will equal the uncorrected cored x, i.e.

$$\sum_{j=1}^{m} 2^{B_j} b_j = x \quad \text{EQ. 8}$$

If the bits produced by the first R sections or stages of the A/D converter are used to determine the interval i, then the mismatch error in these sections or stages can be included in the offset coefficients A(i) to define a new set of offset coefficients:

$$\hat{A}(i) = -A(i) + [1 - G(i)] \sum_{j=1}^{R} [2^{B_j} b_j - E_j(b_j)] \quad \text{EQ. 9}$$

and define a new set of mismatch coefficients:

$$\hat{E}_j(b_j) = 2^{B_j} b_j - E_j(b_j) \quad \text{EQ. 10}$$

and a new set of gain coefficients:

$$\hat{G}(i) = 1 - G(i) \quad \text{EQ. 11}$$

For the sections or stages which determine the lower-order t bits of the uncorrected code, the mismatch errors have a negligible effect on the accuracy of the uncorrected code, so that the last t bits can be multiplied directly by the gain coefficients G(i). Taking this into account, EQ. 7 reduces to:

$$x - \epsilon_{total} = \hat{A}(i) + \left[ \sum_{j=R+1}^{R+S} \hat{G}(i) \hat{E}_j(b_j) \right] + \hat{G}(i) x_t \quad \text{EQ. 12}$$

where S is the number of sections or stages used to determine the intermediate s bits and $x_t$ represents the last t bits of the uncorrected code.

Referring to FIG. 1, the Â(i) coefficients are stored in lookup table 152, the Ĝ(i) coefficients are stored in lookup table 154, and the $\hat{E}_j$ coefficients are stored in lookup tables 156. EQ. 12 is implemented by utilizing a series of mismatch multipliers 160 to multiply each of the mismatch coefficients obtained from the mismatch look-up tables 156 by the gain coefficient obtained from the gain look-up table 154 to produce a multiplied mismatch code.

As also shown, an end-bit multiplier 162 is utilized to multiply the last t bits of the uncorrected code by the gain coefficients to produce a last code. As stated above, the last t bits of the uncorrected code are not utilized to address a look-up table since the error introduced by component mismatches in the sections or stages used to determine these bits would be insignificant. The offset coefficient code, each of the multiplied mismatch codes, and the last code are then summed together by an adder 164 to produce the corrected code.

Recall that in the preferred embodiment the mismatch function is the sum of mismatches for individual bits, so the calculations in EQ. 12 are considerably simplified. In order to avoid some of the multiplications in EQ. 12, a new set of coefficients $K_{ij}$ is defined as:

$$K_{ij} = \hat{G}(i) \hat{E}_j = (1 - G_i)(2^j - E_j) \quad \text{EQ. 13}$$

so that the calculation of the corrected code can be simplified to:

$$x - \epsilon_{total} = \hat{A}(i) + \left[ \sum_{j=r+1}^{r+s} K_{ij} b_j \right] + \hat{G}(i) x_t \quad \text{EQ. 14}$$

Referring to FIGS. 6A–6F, Â(i), Ĝ(i), and $K_{ij}$ are the coefficients that must be stored in lookup tables 152, 154, and 156, respectively.

Although the corrected code can be calculated from the uncorrected code by explicitly performing the multiplications indicated in FIG. 1, this leads to an inefficient hardware implementation since several multipliers must be included in the design. In the preferred embodiment, the first r bits are utilized to address look-up tables which store the multiplied results $K_{ij}$.

FIGS. 6A–6F show a block diagram which illustrates the preferred embodiment of the present invention. As shown in FIGS. 6A–6F, only the last 11 bits of the uncorrected code are actually multiplied. Also, in case it is desired to use a value for $C_y$ other than the value $^{64}/_{64} C$, which would make this part of the array have a weight, the last five bits can be multiplied by a separate fixed gain of the corrected code. Since these bits are not multiplied by the gain coefficient Ĝ(i), the implementation does not correspond exactly to EQ. 12, but the difference is negligible due to the small weight of the last five bits.

In the preferred embodiment, six error correction coefficients (an offset coefficient, a gain coefficient, and four mismatch coefficients) are needed for each of the 16 intervals. As a result, all of the correction data fits into an EEPROM of less than 2K bits. If a piecewise-constant model were used, the amount of memory required would increase to more than 6K since 256 intervals would be required to achieve the same level of accuracy. If the linear interpolation technique were used, the memory requirement would be smaller but the power consumption and the overall die area would be larger since the mismatch and nonlinearity errors would need to be calculated separately, and additional adders and multipliers would be required.

Since the uncorrected code and the corrected code are distinct, they need not have the same number of bits. Using more bits in the uncorrected code allows superior linearity performance to be achieved in the corrected code. Using two more bits in the uncorrected code than in the corrected code, as is done in the preferred embodiment, allows the transition points to be set to within approximately ¼ LSB of their optimal locations. The redundant (radix<2) coding introduced to prevent regions of low code density also reduces the resolution achieved and makes it necessary to use extra bits in the uncorrected code to achieve the desired precision.

Quantization in the mismatch coefficients can also cause significant errors since many of them (one for every bit set to one in the uncorrected code) are added together. This makes it necessary to store the coefficients and perform the calculations at a greater precision than the number of bits of precision desired in the corrected code. The standard deviation of noise from quantization errors (as a fraction of full-scale) is given by:

$$\sigma_{quantization} = \sqrt{\frac{\frac{n}{2} 2^{-2q} + 2^{-2n}}{12}} \quad \text{EQ. 15}$$

where n is the number of uncorrected bits and q is the number of bits of precision with which the mismatch coefficients are stored. The multiplications indicated in FIG. 1 are also assumed to be performed with a precision of q bits. In the preferred embodiment, the uncorrected code is generated by a 19-bit successive-approximation engine, and the error coefficients are stored with 20-bit precision. This reduces the quantization noise to 0.14 LSB, which is not significant in comparison to other sources of error.

The correction coefficients can be determined in the factory and stored as a look-up table in a nonvolatile memory, such as an electrically-erasable programmable read-only-memory (EEPROM), when the chip is fabricated, or circuitry can be included to measure the coefficients and store them in a volatile memory during a self-calibration cycle, typically performed when power is first applied. In the preferred embodiment, the coefficients are stored as a look-up table in a factory-calibrated EEPROM.

The advantage of a factory-calibrated EEPROM is that a smaller die area is required since the calibration circuitry need not be implemented on the chip. Factory calibration also makes it feasible to consider calibration algorithms involving more complex computations. The disadvantage of factory calibration is that any drift over time or temperature can result in inaccuracies in the calibration coefficients, which will lead to distortion in the A/D converter. The capacitors of capacitor array 124, however, have sufficiently good aging properties to maintain the required precision over the life of the device.

Referring to FIGS. 6A–6F, whenever the core A/D converter 120 is implemented as a successive-approximation converter, as it is in the preferred embodiment, the additions performed by adder 164 can be performed sequentially as the bits of the conversion process become available. The coefficients stored in lookup tables 152, 154, and 156 can also be accessed sequentially, which permits them to be stored in a single memory array.

Figure 7:
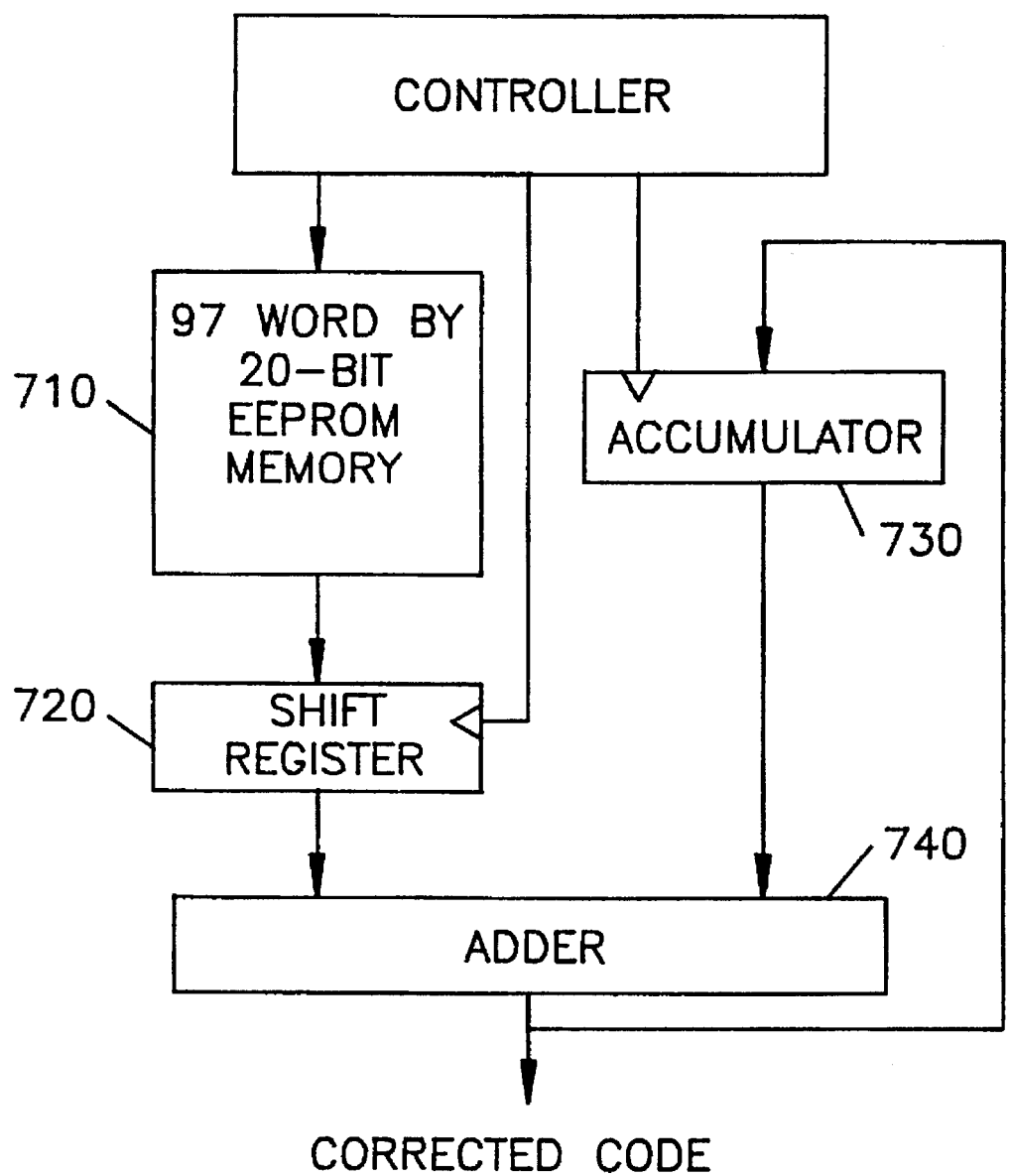
FIG. 7 is a block diagram illustrating a computation engine that efficiently performs the calculations shown in FIG. 6.
Figure 8A:
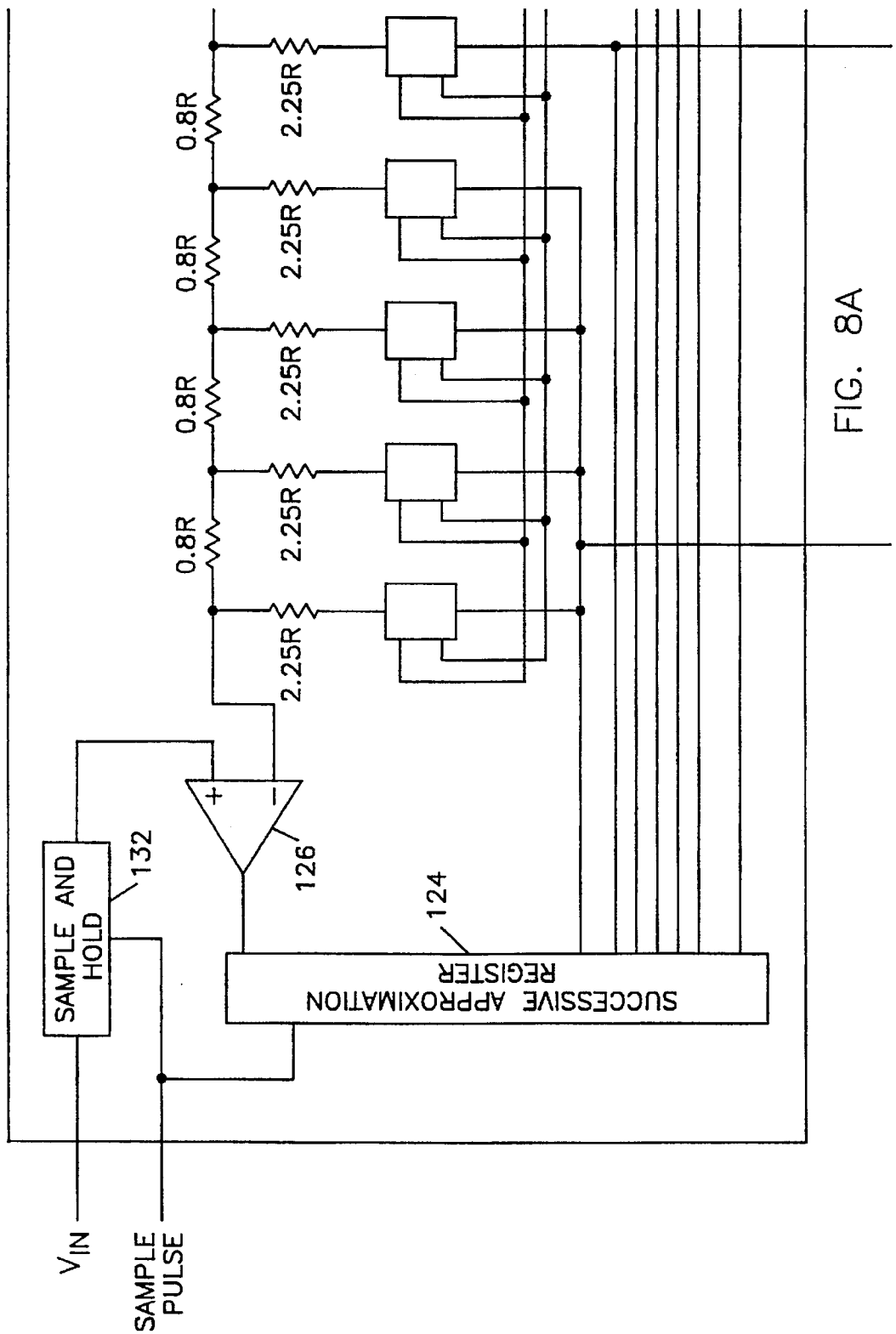
Figure 8B:
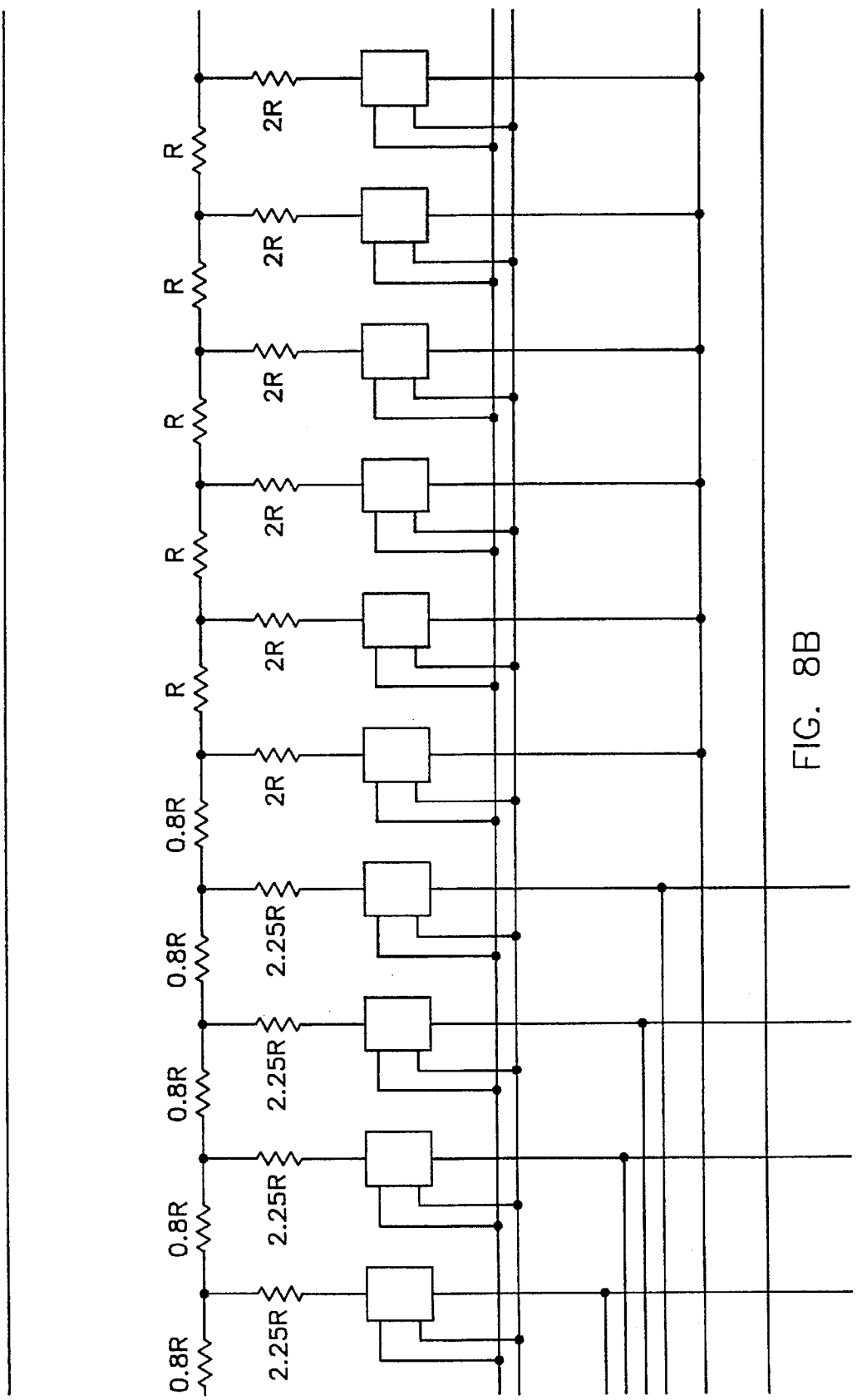
Figure 8C:
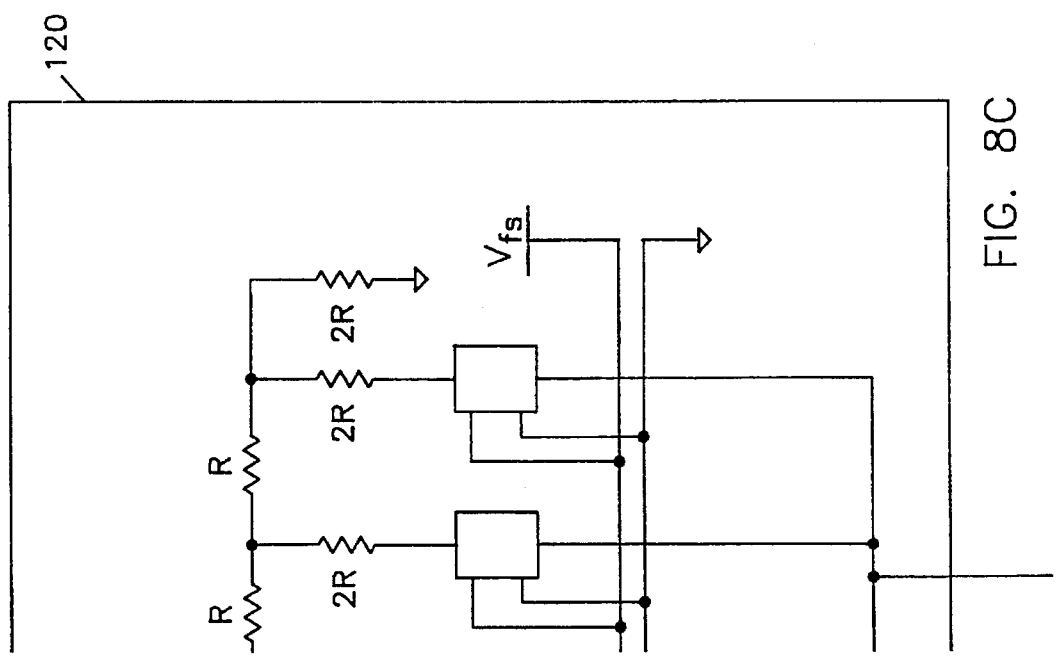
Figure 8D:
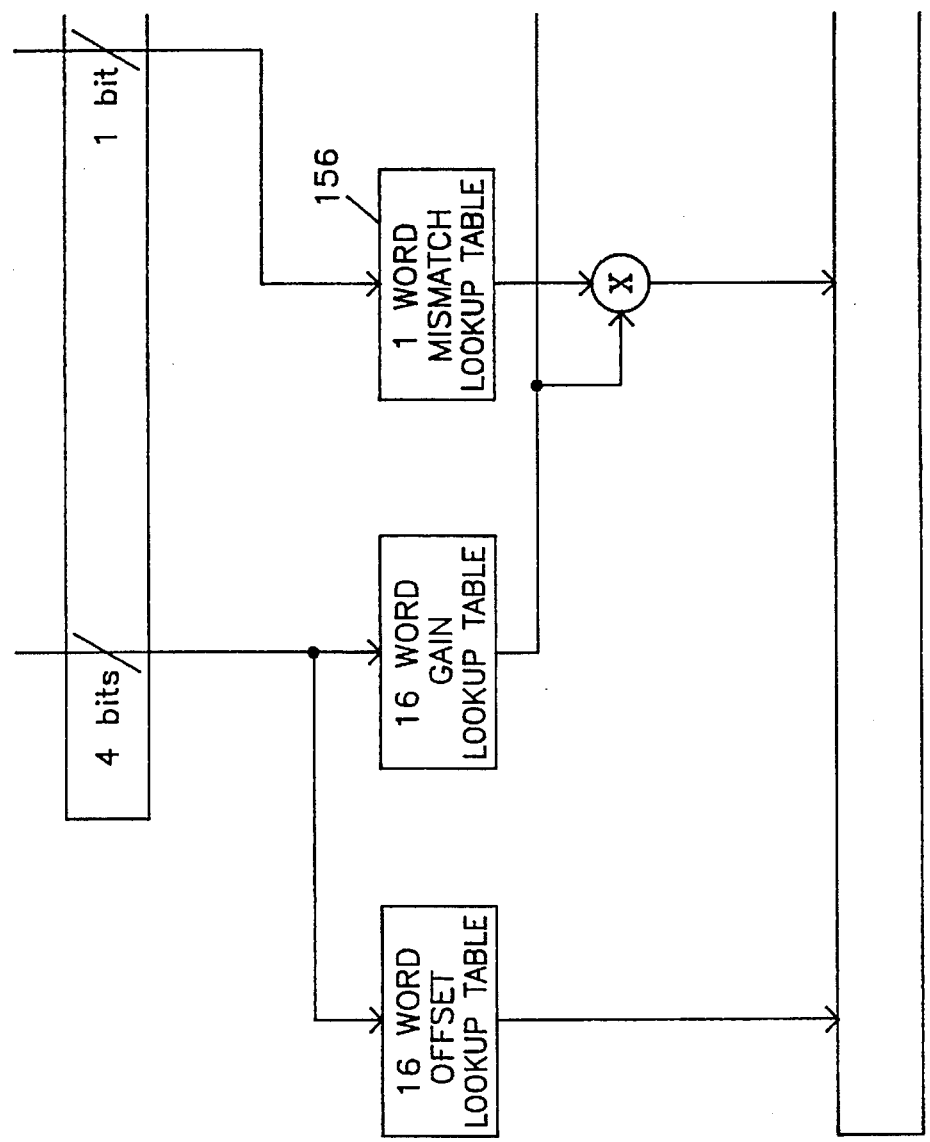
Figure 9A:
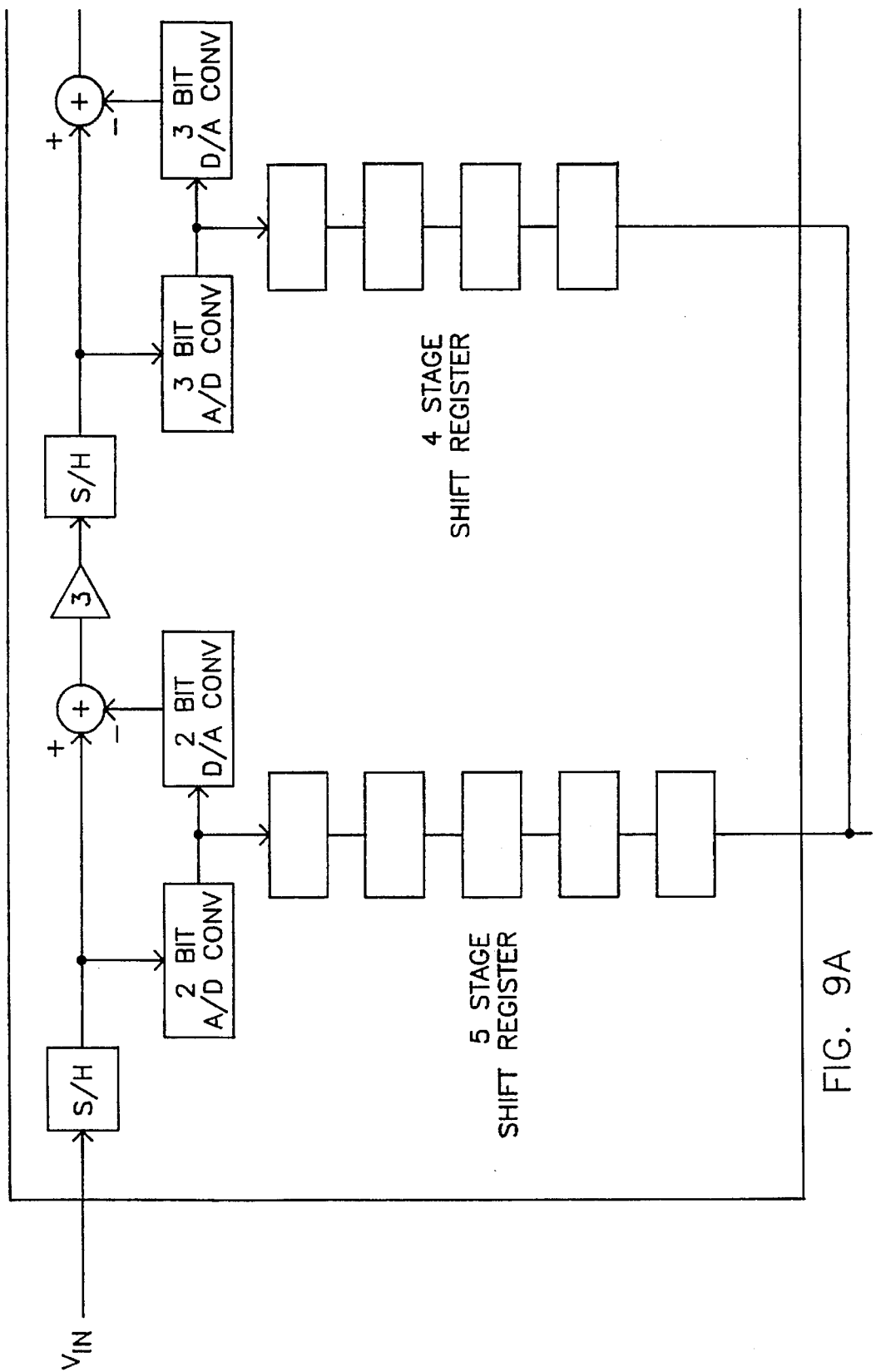
Figure 9B:
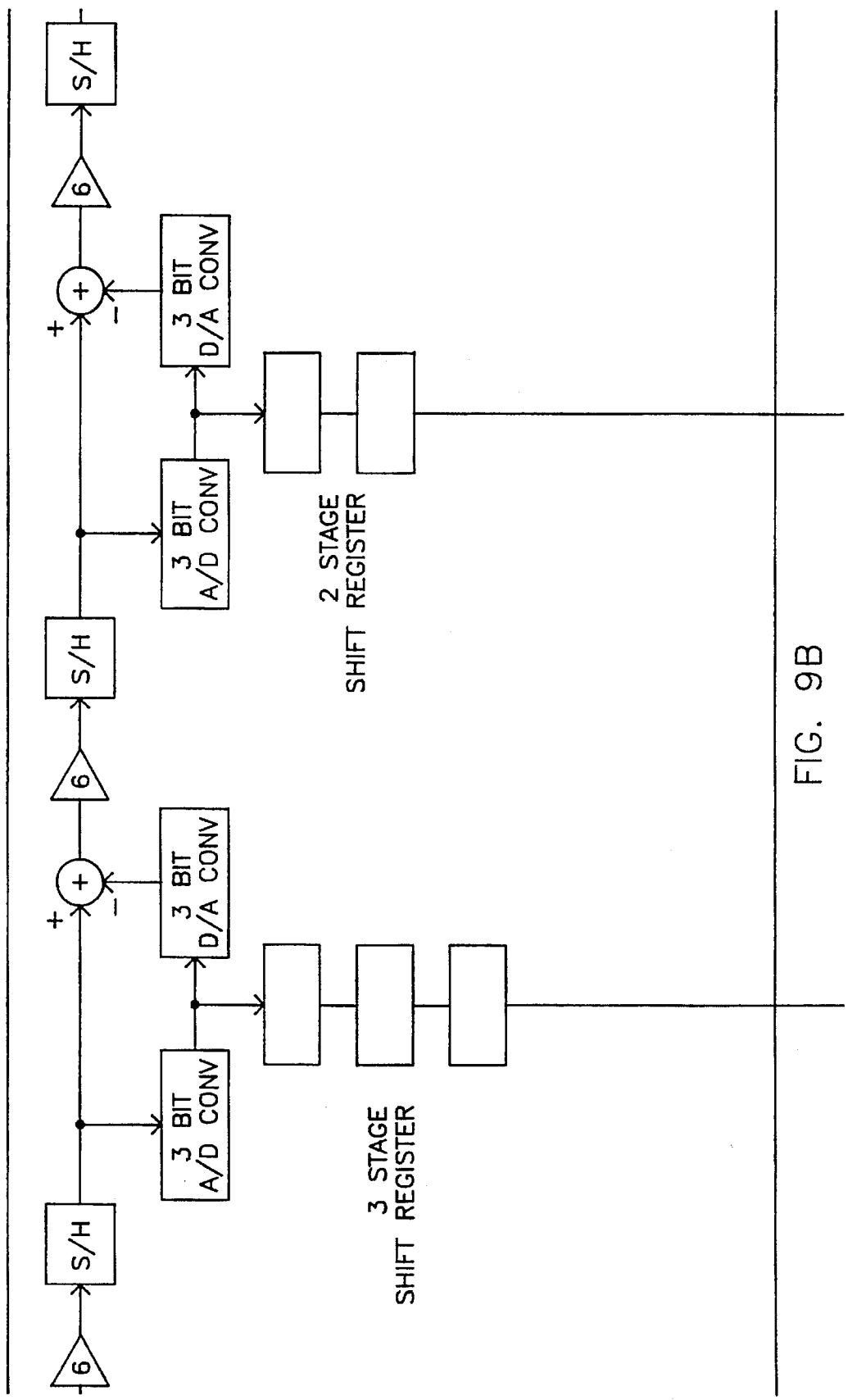
Figure 9C:
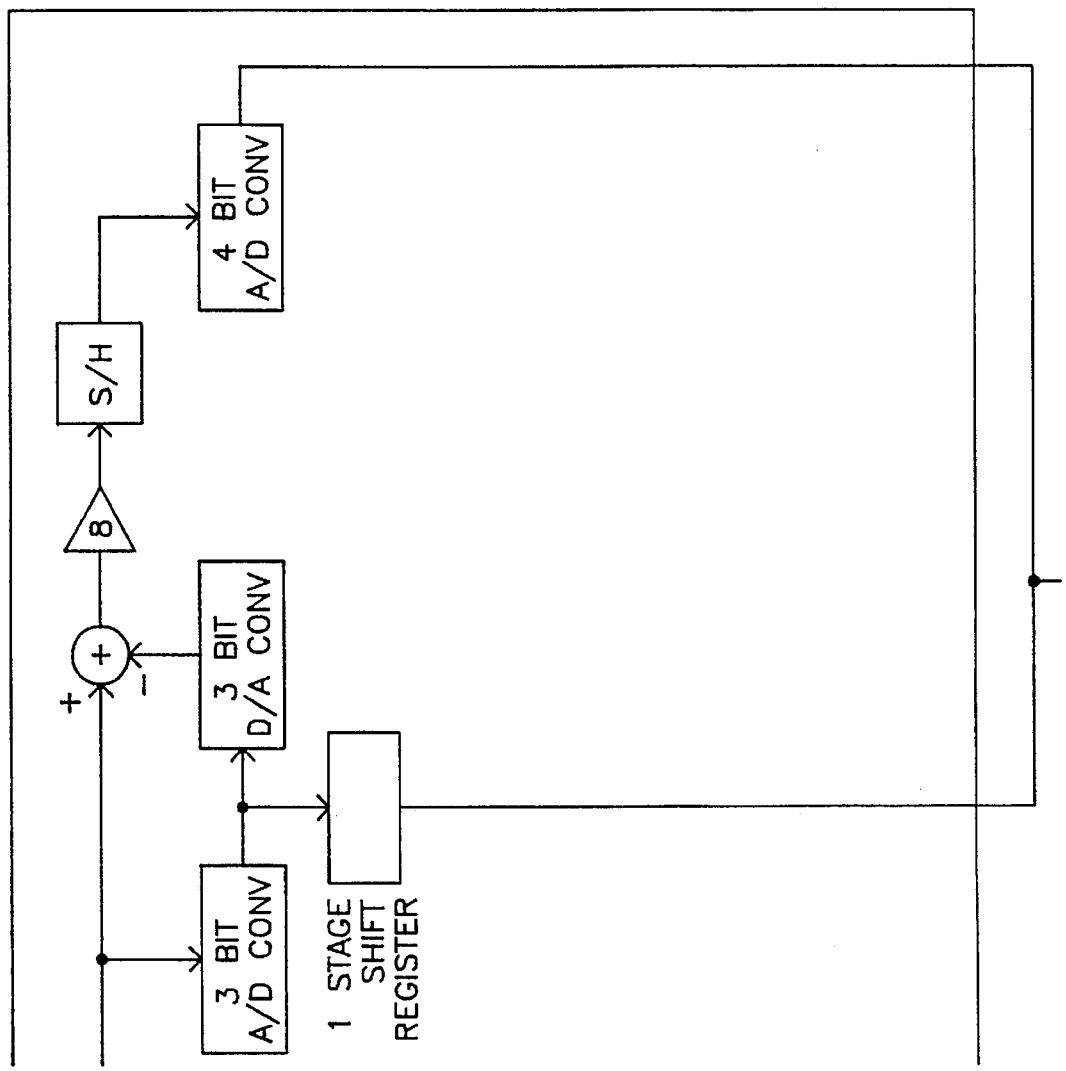
Figure 9D:
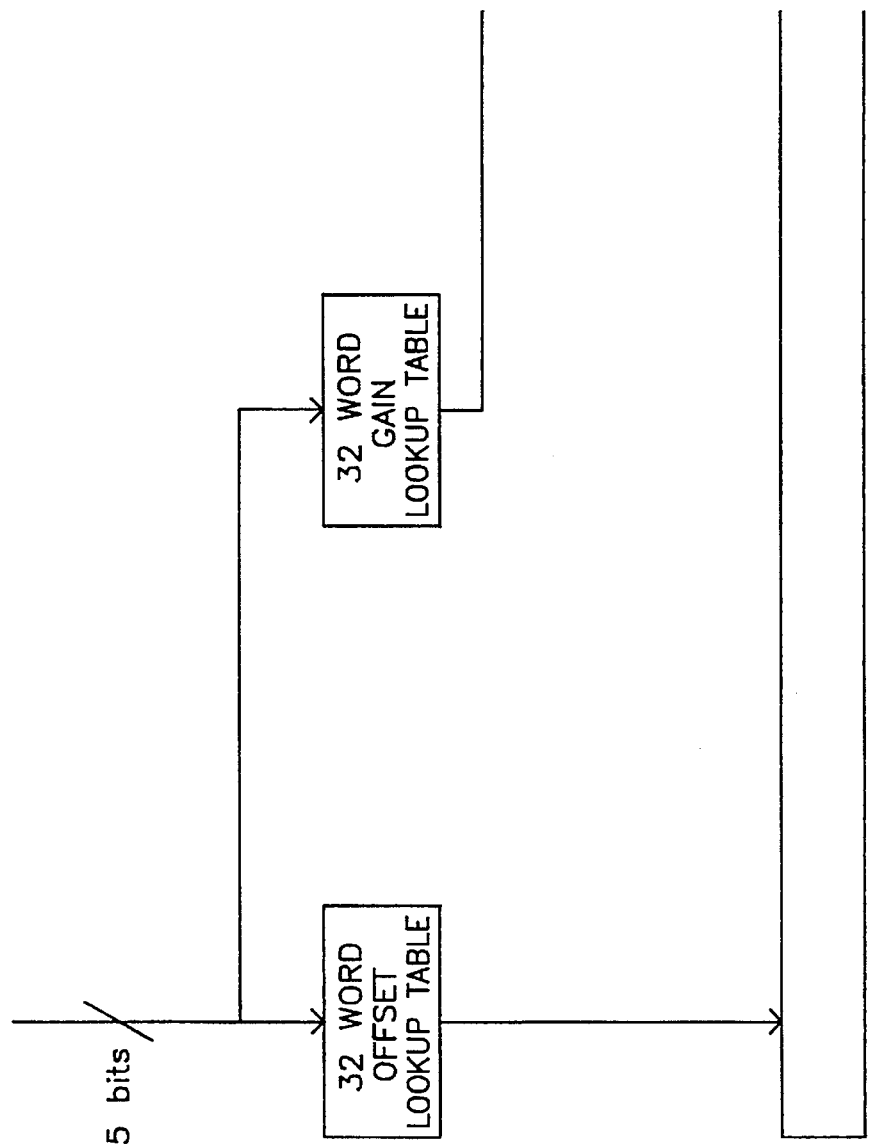
Figure 9F:
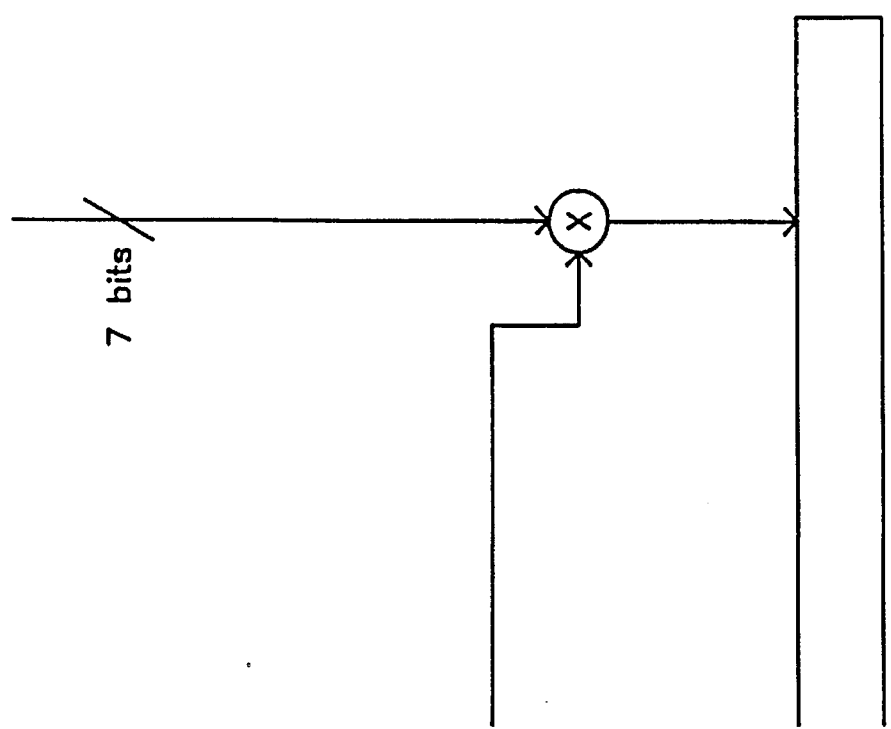

A sequential computing engine which takes advantage of these features of a successive approximation A/D converter is shown in FIG. 7. After the first four bits of the conversion are available, and the interval of the input signal has thus been determined, the appropriate offset coefficient for this interval is retrieved from memory array 710 and loaded into accumulator 730 via adder 740. Shift register 720 is set up during this period to pass data through unaltered. As more bits from the conversion become available, the appropriate $K_{ij}$ coefficients are retrieved from memory array 710 and added to accumulator 730 using adder 740. The coefficients are added only for bits that have a value of 1.

After four more bits have been processed in this way, the appropriate gain coefficient is retrieved from the memory array 710 and loaded into shift register 720. The shift register is shifted once after each bit is processed by the A/D converter and the contents of the shift register are added to the accumulator whenever the bit just processed by the A/D converter is a one, so that the computing engine effectively performs a multiplication operation between the gain coefficient and the output of the A/D converter. For the last five bits of the conversion, a new gain coefficient can be loaded from memory array 710 to provide a different gain for the bits produced by the last capacitor bank.

Although a specific A/D converter implementation has been described, one skilled in the art will immediately recognize that converter 110 can be implemented with any conventional A/D converter which provides a code density that is sufficient to allow each voltage interval to be resolved into a distinct digital code. Examples of such converters are a successive-approximation A/D converter which utilizes a resistive ladder in lieu of a capacitor array for the D/A converter, and a pipelined converter.

FIG. 8A–8F show a block diagram that illustrates the use of a resistive ladder architecture. As described in Z. G. Boyacigiller, et al., "An Error correcting 14 b/20 us CMOS A/D converter," 1981 IEEE International Solid State Circuits Conference, pp. 62, a resistor ladder can be designed such that the weights of some of the bits are set according to a radix less than two. In this architecture, an explicit sample and hold circuit 132 is required. Successive-approximation register 124, comparator 126 and switches 130 function in essentially the same way that they do in the preferred embodiment.

In the embodiment shown in FIG. 8A–8F, the nonlinearity errors are corrected with 16 pairs of offset and gain coefficients (r=4), and correction for mismatch error is performed for these bits and also the next 5 bits (s=5). The remaining 8 bits are multiplied directly by the gain coefficient. As in the case of the preferred embodiment, the mismatch errors for the individual bits are independent. The resistor values are chosen such that the first 9 bits (r+s) have a radix of 1.8 to ensure that mismatch errors do not cause regions of insufficient code density. The remaining resistor values are chosen such that the remaining bits have a radix of 2, since for the loworder bits mismatch errors are not significant. Since the low order bits are in a binary (radix-2) format, they can be multiplied directly with the gain coefficient.

An embodiment of the present invention in which A/D converter 110 is implemented as a pipelined converter is shown in FIGS. 9A–9F. A pipelined converter consists of a series of stages, each of which resolves several bits of the input signal, amplifies the residual error signal and provides the amplified residual error signal to the following stage. If the gain following the kth stage were set to $2^{N_k}$, where $N_k$ is the number of bits resolved in the kth stage, then the weight of all of the bits would be binary. To prevent the mismatch error in the stages from causing regions of insufficient code density, the gains following the first four stages are set to values less than b $2^{N_k}$. For example, the gain after the first stage is set to 3 rather than 4, and the gain after the second, third and fourth stages is set to 6 rather than 8. The gain after the fifth stage is set to 8, so that the last seven bits of the uncorrected code will have binary weights. This permits them to be multiplied by the gain directly, as shown in FIG. 9A–9F. In this type of embodiment, it will usually be necessary to process all of the inputs to adder 164 simultaneously in order to prevent a degradation in the speed of the A/D converter.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. A high-resolution, error-correcting analog-to-digital (A/D) conversion circuit comprising:

a core A/D converter that continuously samples an analog input signal, divides the maximum voltage range of the analog input signal into a plurality of intervals, determines which of the plurality of intervals bounds the sampled input signal, and outputs an n-bit uncorrected code that uniquely identifies the interval that bounds the sampled input signal, the n bits of the uncorrected code including a first r bits, an intermediate s bits, and a last t bits;

an offset look-up table that receives the first r bits of the n-bit uncorrected code, and outputs a x-bit offset coefficient code;

a gain look-up table that receives the first r bits of the n-bit uncorrected code, and outputs a y-bit gain coefficient code;

a plurality of mismatch look-up tables, each mismatch look-up table receiving one or more of the intermediate s bits of the n-bit uncorrected code, and outputting a z-bit mismatch coefficient code;

a plurality of mismatch multipliers which correspond with the plurality of mismatch look-up tables, each mismatch multiplier multiplying the y-bit gain coefficient code to one of the z-bit mismatch coefficient codes to produce a multiplied mismatch code;

an end bit multiplier that receives the last t bits of the n-bit uncorrected code, and multiplies the gain coefficient code to the last t bits of the uncorrected code to produce a last code; and an adder that sums the offset coefficient code, each of the multiplied mismatch codes, and the last code to produce a corrected code.

2. The conversion circuit of claim 1 wherein each mismatch table includes a memory that stores a plurality of coefficients.

3. The conversion circuit of claim 2 wherein the coefficients compensate for component mismatch errors produced by components of the core A/D converter that produce the intermediate s bits.

4. The conversion circuit of claim 1 wherein the offset look-up table includes a memory that stores a plurality of coefficients.

5. The conversion circuit of claim 4 wherein the coefficients compensate for nonlinearity errors produced by the core A/D converter.

6. The conversion circuit of claim 1 wherein the gain look-up table includes a memory that stores a plurality of coefficients.

7. The conversion circuit of claim 6 wherein the coefficients compensate for nonlinearity errors produced by the core A/D converter.

8. The conversion circuit of claim 1 wherein the plurality of mismatch tables corresponds to the number of intermediate s bits.

9. The conversion circuit of claim 1 wherein the number of bits in the uncorrected code is greater than the number of bits in the corrected code.

10. A high-resolution, error-correcting analog-to-digital (A/D) conversion circuit comprising:

an A/D converter that continuously samples an analog input signal, divides the maximum voltage range of the analog input signal into a plurality of intervals, determines which of the plurality of intervals bounds the sampled input signal, and outputs an n-bit uncorrected code that uniquely identifies the interval that bounds the sampled input signal, the n bits of the uncorrected code including a first r bits, a first intermediate s1 bits, a second intermediate s2 bits, and a last t bits;

an offset look-up table that receives the first r bits of the n-bit uncorrected code, and outputs a x-bit offset coefficient code;

a gain look-up table that receives the first r bits of the n-bit uncorrected code, and outputs a y-bit gain coefficient code;

a plurality of mismatch look-up tables, each mismatch look-up table receiving the first r bits and one or more of the first intermediate s1 bits of the n-bit uncorrected code, and outputting a z-bit mismatch coefficient code;

a first multiplier that multiplies the second intermediate s2 bits of the n-bit uncorrected code to the gain coefficient to produce a variable gain code;

a second multiplier that multiplies the last t bits of the n-bit uncorrected code to a fixed gain coefficient to produce a fixed gain code; and an adder that sums the offset coefficient code, each of the mismatch coefficient codes, the variable gain code, and the fixed gain code to produce a corrected code.

11. The conversion circuit of claim 10 wherein each mismatch table includes a memory that stores a plurality of coefficients.

12. The conversion circuit of claim 11 wherein the coefficients compensate for component mismatch errors produced by components of the core A/D converter that produce the intermediate s bits.

13. The conversion circuit of claim 10 wherein the offset look-up table includes a memory that stores a plurality of coefficients.

14. The conversion circuit of claim 13 wherein the coefficients compensate for nonlinearity errors produced by the core A/D converter.

15. The conversion circuit of claim 10 wherein the gain look-up table includes a memory that stores a plurality of coefficients.

16. The conversion circuit of claim 15 wherein the coefficients compensate for nonlinearity errors produced by the core A/D converter.

17. The conversion circuit of claim 10 wherein the plurality of mismatch tables corresponds to the number of intermediate s1 bits.

18. The conversion circuit of claim 10 wherein the number of bits in the uncorrected code is greater than the number of bits in the corrected code.

* * * * *